(12) United States Patent
Jung

(10) Patent No.: US 7,071,082 B2
(45) Date of Patent: Jul. 4, 2006

(54) SILICON CRYSTALLIZATION METHOD

(75) Inventor: Yun-Ho Jung, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 122 days.

(21) Appl. No.: 10/939,474

(22) Filed: Sep. 14, 2004

(65) Prior Publication Data

US 2005/0048382 A1 Mar. 3, 2005

Related U.S. Application Data

(62) Division of application No. 10/163,419, filed on Jun. 7, 2000, now Pat. No. 6,825,493.

(30) Foreign Application Priority Data

Jun. 8, 2001 (KR) ............................ 2001-0031878

(51) Int. Cl.
*H01L 21/20* (2006.01)
(52) U.S. Cl. ........................................ 438/486; 257/59
(58) Field of Classification Search .................. 438/30, 438/154, 149, 150, 158, 166, 486–488; 257/57, 257/59, 64–66, 69, 72, 74, 75
See application file for complete search history.

(56) References Cited

U.S. PATENT DOCUMENTS

| 5,696,388 A | * | 12/1997 | Funada et al. ................. 257/64 |
| 5,969,377 A | * | 10/1999 | Seo .............................. 257/72 |
| 6,020,244 A | * | 2/2000 | Thompson et al. .......... 438/302 |
| 6,489,222 B1 | * | 12/2002 | Yoshimoto ................... 438/486 |

* cited by examiner

*Primary Examiner*—David Vu
(74) *Attorney, Agent, or Firm*—McKenna Long & Aldridge LLP

(57) ABSTRACT

Sequential lateral solidification (SLS) crystallization of amorphous silicon using a mask having striped light transmitting portions. An amorphous silicon bearing substrate is located in an SLS apparatus. The amorphous silicon film is functionally divided into a driving region (for driving devices) and a display region (for TFT switches). Part of the driving region is crystallized by a laser that passes through the mask. The mask is then moved relative to the substrate by a translation distance that is less than half the width of the light transmitting portions. Thereafter, subsequent crystallizations are performed to crystallize the driving region. Then, part of the display region is crystallized by a laser that passes through the mask. The mask is then moved relative to the substrate by a translation distance that is more than half the width of the light transmitting portions. Thereafter, subsequent crystallizations are performed to crystallize the display region.

22 Claims, 29 Drawing Sheets

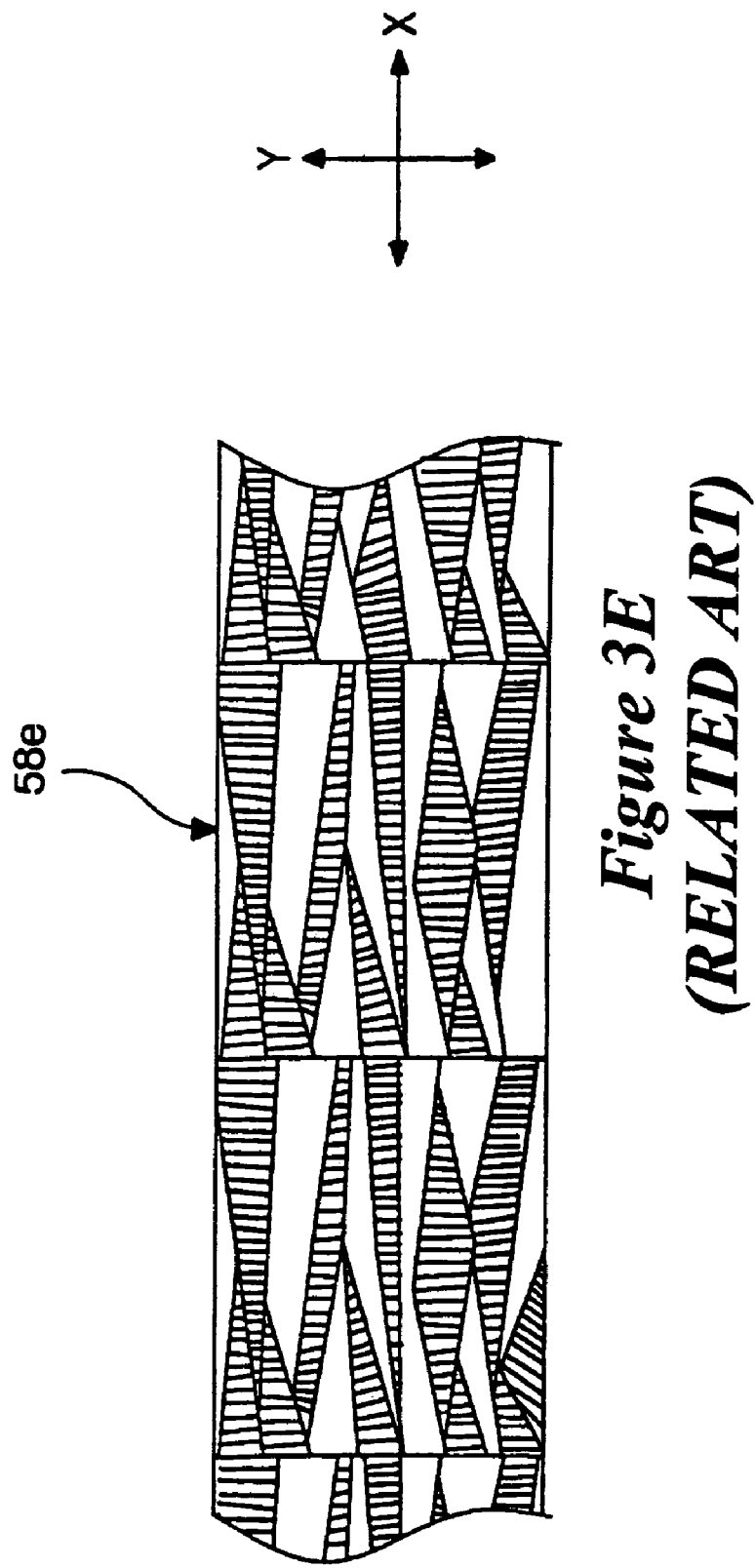

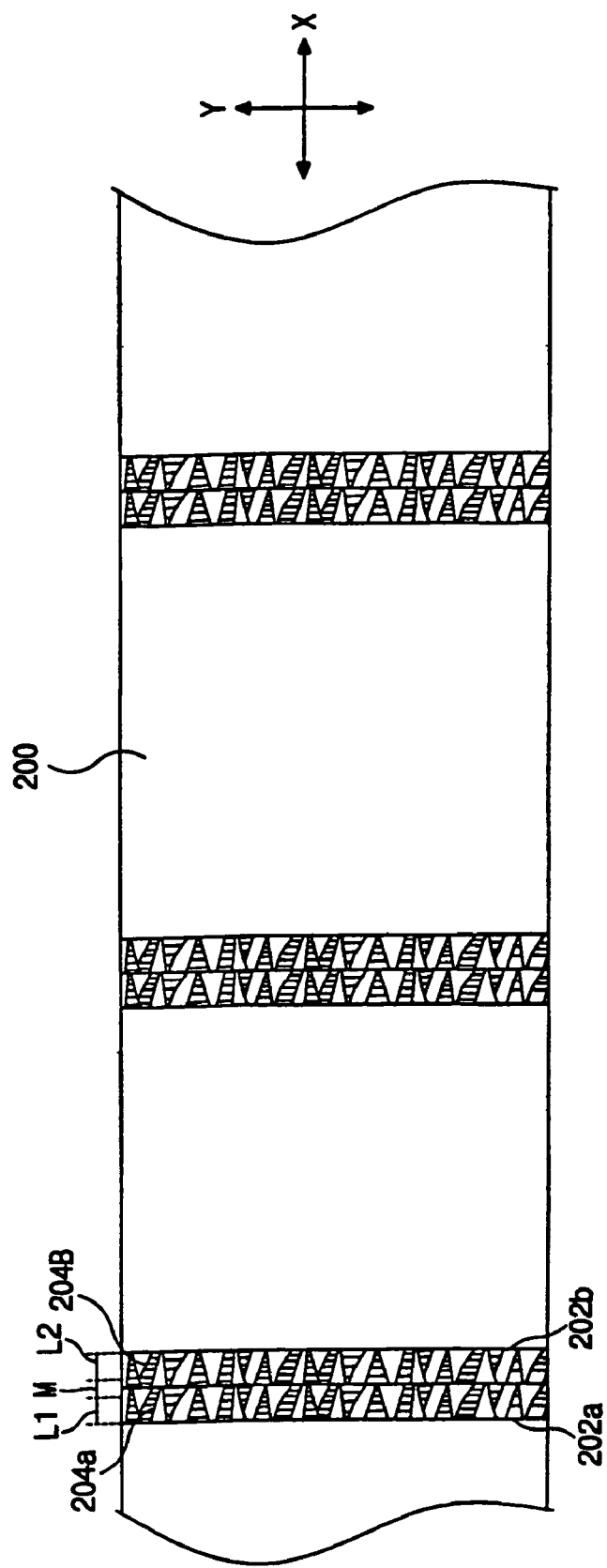

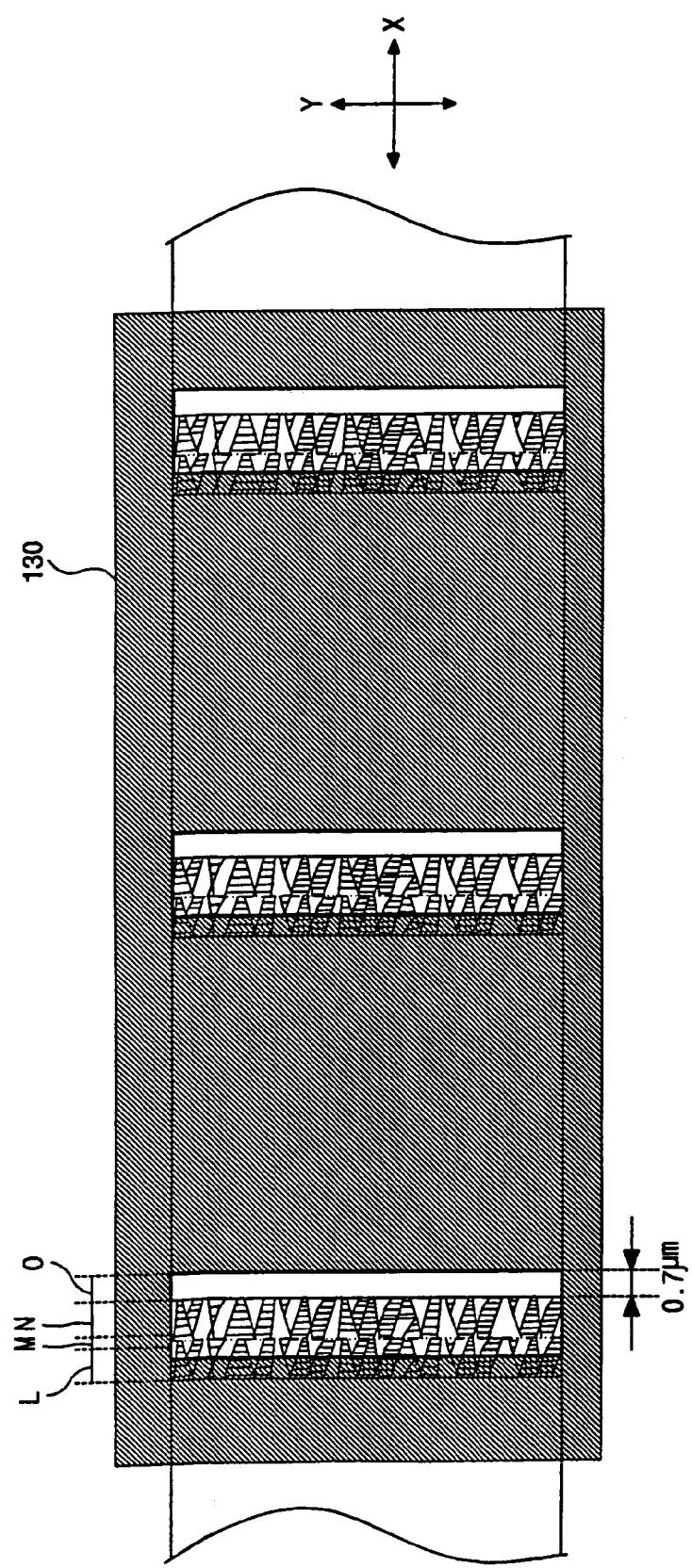

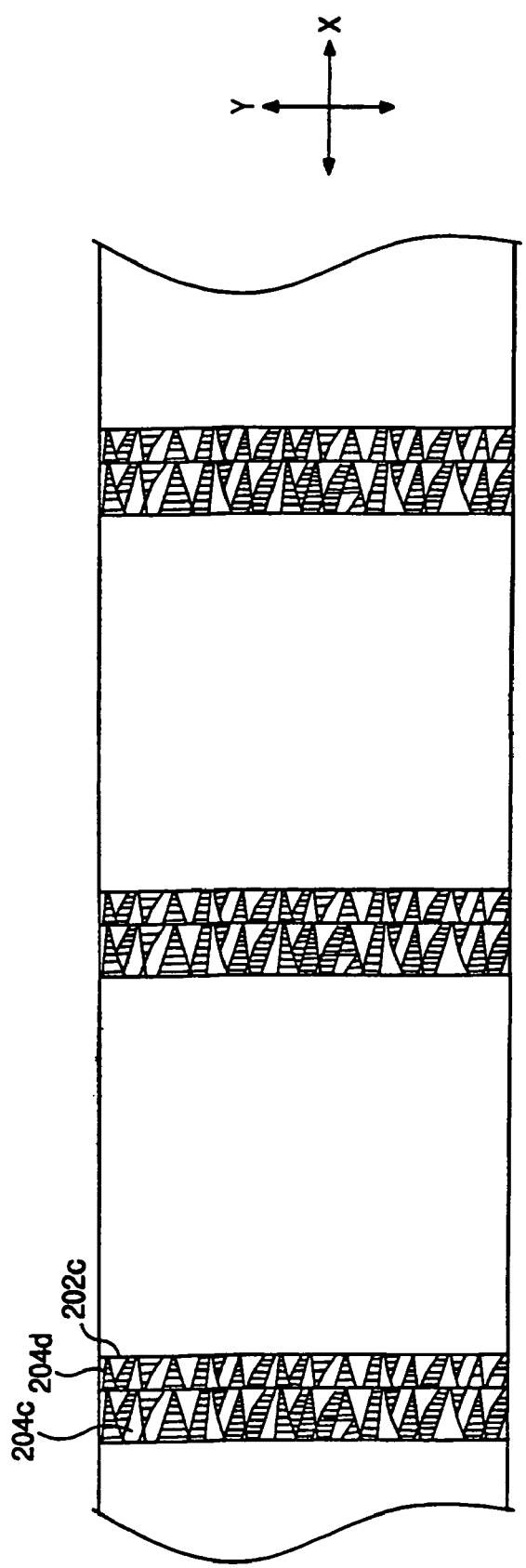

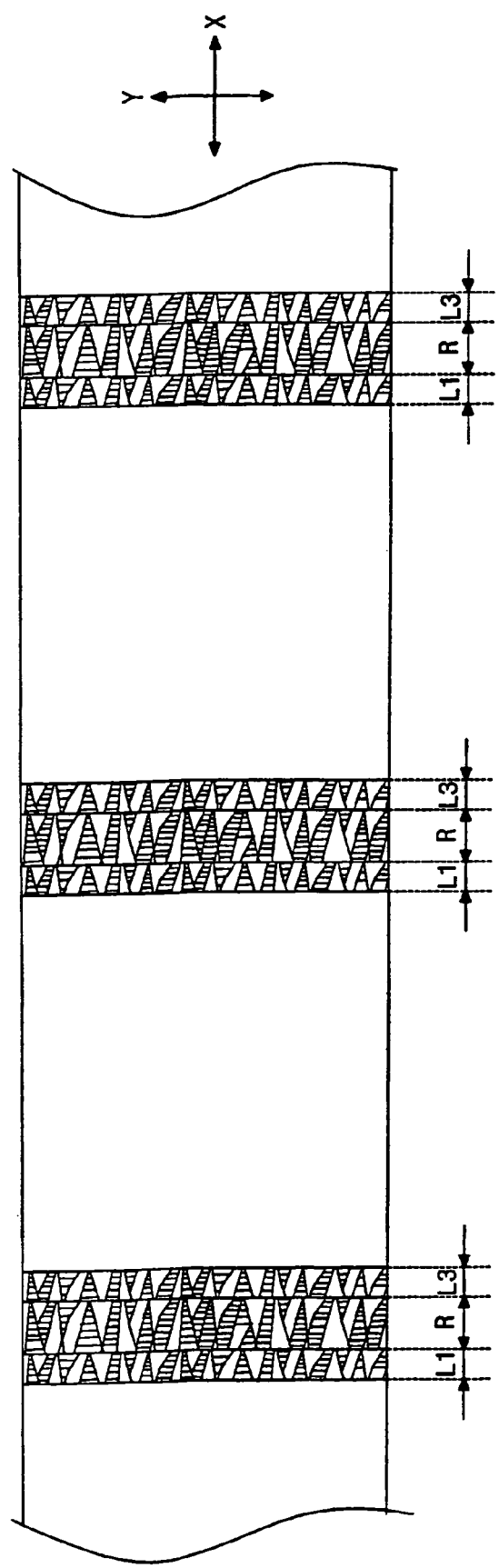

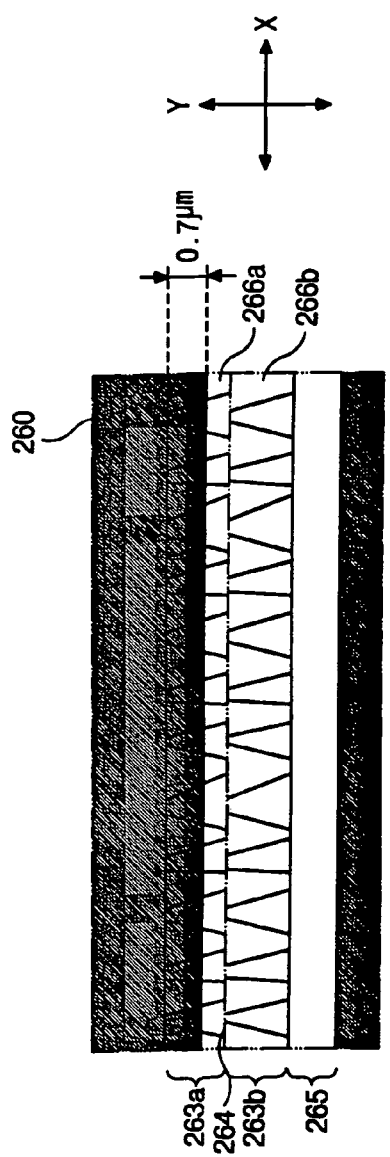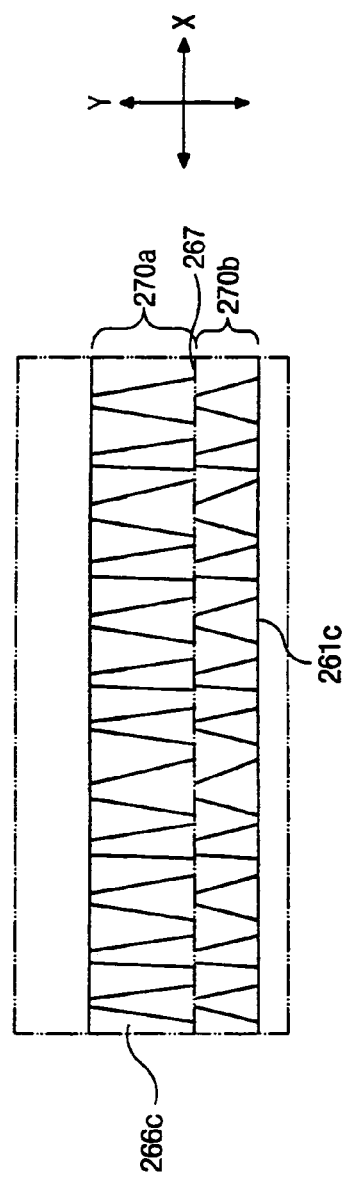

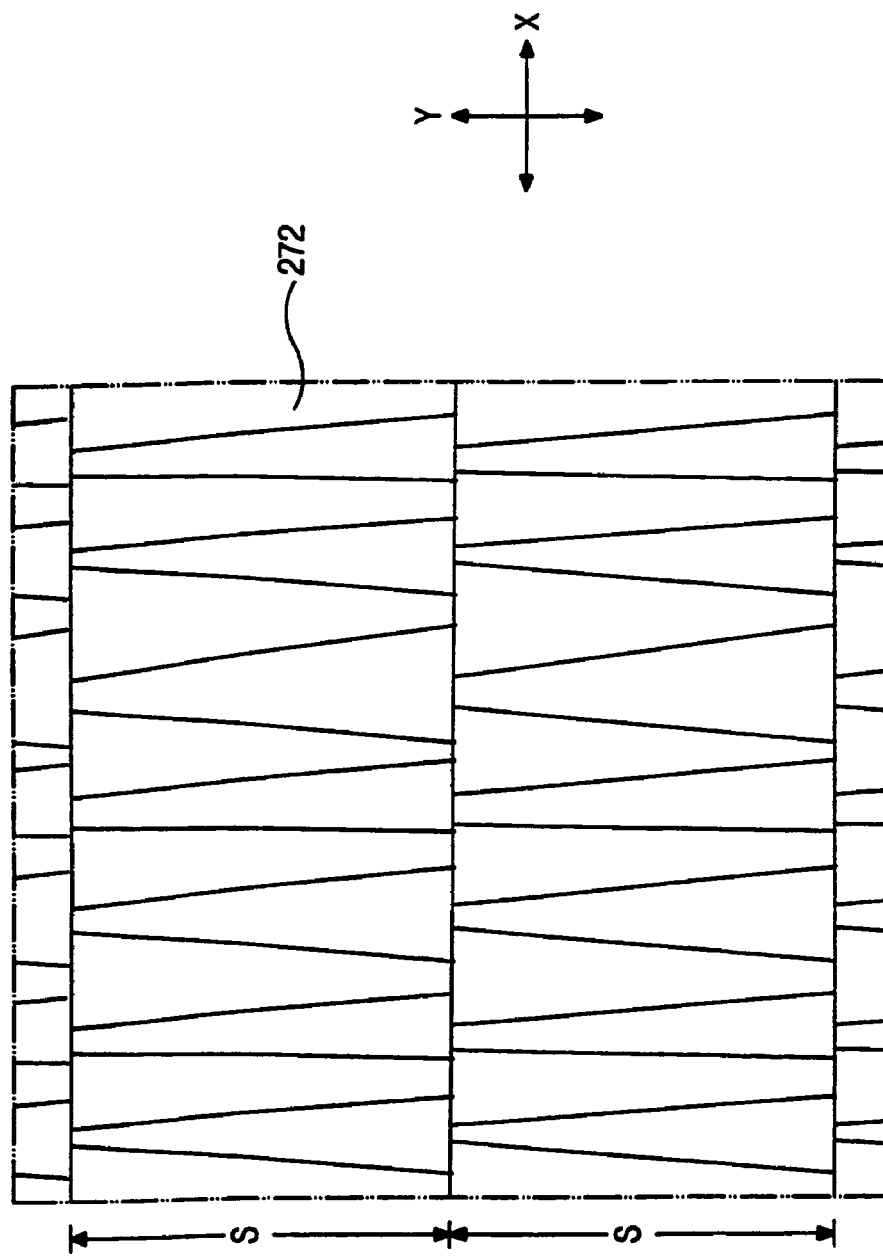

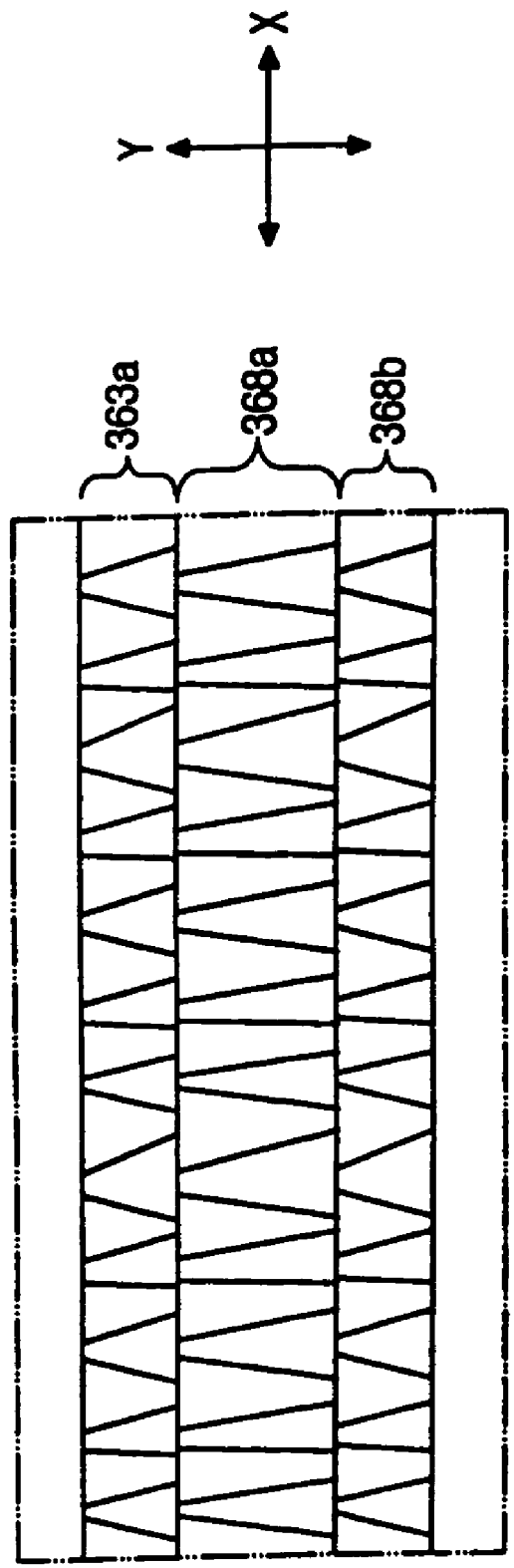

SILICON CRYSTALLIZATION METHOD

This application is a divisional of prior application Ser. No. 10/163,419, filed Jun. 7, 2002 now U.S. Pat. No. 6,825,493.

This application claims the benefit of Korean Patent Application No. 2001-31878, filed in Korea on Jun. 8, 2001, and which is hereby incorporated by reference as it fully set forth herein.

BACKGROUND OF THE INVENTION

1. Field of the Invention

The present invention relates to a method of crystallizing an amorphous silicon film, and more particularly, to a crystallization method using sequential lateral solidification (SLS).

2. Discussion of Related Art

Polycrystalline silicon (p-Si) and amorphous silicon (a-Si) are often used as active layer materials for thin film transistors (TFTs) in liquid crystal display (LCD) devices. Since amorphous silicon (a-Si) can be deposited at a low temperature to form a thin film on a glass substrate, amorphous silicon (a-Si) is commonly used in switching devices of liquid crystal displays (LCDs). Unfortunately, amorphous silicon (a-Si) TFTs have relatively slow display response times that limit their suitability for large area LCD.

In contrast, polycrystalline silicon TFTs provide much faster display response times. Thus, polycrystalline silicon (p-Si) is well suited for use in large LCD devices, such as laptop computers and wall-mounted television sets. Such applications often require TFTs having field effect mobility greater than 30 $cm^2/Vs$ together with low leakage current.

A polycrystalline silicon film is composed of crystal grains having grain boundaries. The larger the grains and the more regular the grains boundaries the better the field effect mobility. Thus, a silicon crystallization method that produces large grains, ideally a single crystal, would be useful.

One method of crystallizing amorphous silicon into polycrystalline silicon is sequential lateral solidification (SLS). SLS crystallization uses the fact that silicon grains tend to grow laterally from the interfaces between liquid and solid silicon such that the resulting grain boundaries are perpendicular to the interfaces. With SLS, amorphous silicon is crystallized using a laser beam having a magnitude and a relative motion that melts amorphous silicon such that the melted silicon forms laterally grown silicon grains upon re-crystallization.

FIG. 1A is a schematic configuration of a conventional sequential lateral solidification (SLS) apparatus, while FIG. 1B shows a plan view of a conventional mask 38 that is used in the apparatus of FIG. 1A. In FIG. 1A, the SLS apparatus 32 includes a laser generator 36, a mask 38, a condenser lens 40, and an objective lens 42. The laser generator 36 generates and emits a laser beam 34. The intensity of the laser beam 34 is adjusted by an attenuator (not shown) in the path of the laser beam 34. The laser beam 34 is then condensed by the condenser lens 40 and is then directed onto the mask 38.

Specifically referencing FIG. 1B, the mask 38 includes a plurality of slits "A" through which the laser beam 34 passes, and light absorptive areas "B" that absorb the laser beam 34. The width of each slit "A" effectively defines the grain size of the crystallized silicon produced by a first laser irradiation. Furthermore, the distance between each slit "A" defines the size of the lateral grains growth of amorphous silicon crystallized by the SLS method. Referring not to FIG. 1A, the objective lens 42 is arranged below the mask and reduces the shape of the laser beam that passes through the mask 38.

Still referring to FIG. 1A, an X-Y stage 46 is arranged adjacent to the objective lens 42. The X-Y stage 46, which is movable in two orthogonal axial directions, includes an x-axial direction drive unit for driving the x-axis stage and a y-axial direction drive unit for driving the y-axis stage. A substrate 44 is placed on the X-Y stage 46 so as to receive light from the objective lens 42. Although not shown in FIG. 1A, it should be understood that an amorphous silicon film is on the substrate 44, thereby defining a sample substrate.

To use the conventional SLS apparatus, the laser generator 36 and the mask 38 are typically fixed in a predetermined position while the X-Y stage 46 moves the amorphous silicon film on the sample substrate 44 in the x-axial and/or y-axial direction. Alternatively, the X-Y stage 46 may be fixed while the mask 38 moves to crystallize the amorphous silicon film on the sample substrate 44.

When performing SLS crystallization, a buffer layer is typically formed on the substrate 44. Then, an amorphous silicon film is deposited on the buffer layer. Thereafter, the amorphous silicon is crystallized as described above. The amorphous silicon film is usually deposited on the buffer layer using chemical vapor deposition (CVD). Unfortunately, that method produces amorphous silicon with a lot of hydrogen. To reduce the hydrogen content the amorphous silicon film is typically thermal-treated, which causes de-hydrogenation, which results in a smoother surface on the crystalline silicon film. If the de-hydrogenation is not performed, the surface of the crystalline silicon film is rough and the electrical characteristics of the crystalline silicon film are degraded.

FIG. 2 is a plan view showing a substrate 44 having a partially crystallized amorphous silicon film 52. When performing SLS crystallization, it is difficult to crystallize all of the amorphous silicon film 52 at once because the laser beam 34 has a limited beam width, and because the mask 38 also has a limited size. Therefore, with large size substrate, the mask 38 is typically arranged numerous times over the substrate, while crystallization is repeated for the various mask arrangements. In FIG. 2, an area "C" that corresponds to one mask position is defined as a block. Crystallization of the amorphous silicon within a block "C" is achieved by irradiating the laser beam several times.

Crystallization of the amorphous silicon film will be explained as follows. FIGS. 3A to 3E are plan views showing one block of an amorphous silicon film being crystallized using a conventional SLS method. In the illustrated crystallization, it should be understood that the mask 38 (see FIGS. 1A and 1B) has three slits.

As is well known, the length of the lateral growth of a grain is determined by the energy density of the laser beam, by the temperature of substrate, and by the thickness of amorphous silicon film (as well as other factors). The maximum lateral grain growth should be understood as being dependent on optimized conditions. In the SLS method shown in FIGS. 3A to 3E, the width of the slits is less than or equal to twice the maximum lateral grain growth.

FIG. 3A shows an initial step of crystallizing the amorphous silicon film using a first laser beam irradiation. As described with reference to FIG. 1A, the laser beam 34 passes through the mask 38 and irradiates one block of an amorphous silicon film 52 on the sample substrate 44. The laser beam 34 is divided into three line beams by the three slits "A." The three line beams irradiate and melt regions "D", "E" and "F" of the amorphous silicon film 52. The energy density of the line beams should be sufficient to induce complete melting of the amorphous silicon film, i.e., complete melting regime.

Still referring to FIG. 3A, after complete melting, the liquid phase silicon begins to crystallize at interfaces 56a and 56b between the solid phase amorphous silicon and the liquid phase silicon. Namely, lateral grain growth of grains 58a and 58b proceeds from the un-melted regions to the fully-melted regions, so the grain boundaries are substantially perpendicular to the interfaces 56a and 56b (for clarity, only region "D" is shown with interfaces 56a and 56b and grains 58a and 58b, however, it should be understood that regions "E" and "F" also have such features).

Lateral growth stops in accordance with the width of the melted silicon region when: (1) grains grown from interfaces collide near a middle section 50 of the melted silicon region; or (2) polycrystalline silicon particles are formed in the middle section 50 as the melted silicon region solidifies sufficiently to generate solidification nuclei. Further, the grown length of the laterally grown grains is usually 1.5 to 2 micrometers after the laser beam irradiation process. Namely, the grains laterally grown by the first laser beam irradiation can typically have the maximum length generally ranging from 1.5 to 2 micrometers ($\mu m$).

Since the width of the slits "A" (see FIG. 1B) is less than or equal to twice the maximum lateral growth length of the grains, the width of the melted silicon region "D," "E," or "F" is also less than or equal to twice the maximum lateral growth length of the grains. Therefore, lateral grain growth stops when the crystalline silicon collide in the middle section 50, as shown in FIG. 3B.

FIG. 3B is an enlarged view of a portion "C1" of FIG. 3A. As mentioned, the first grains 58a grow from left to right, i.e., from the interface 56a to the center 50, and the second grains 58b grow from right to left, i.e., from the interface 56b to the center 50. When these grains 58a and 58b collide with each other at the center 50, the lateral grain growth stops, thereby defining first grain regions "G1a" and "G1b," and a first border "H1." As discussed above, the grain boundaries in directionally solidified silicon tend to form perpendicular to the interfaces 56a and 56b of the solid phase amorphous silicon and the liquid phase silicon. As a result of the first laser beam irradiation, crystallized regions "D," "E," and "F" each having the first grain regions "G1a" and "G1b" and the first border "H1" are formed in one block. The number of these crystallized regions "D," "E," and "F" will vary depending on the number of the slits "A" of FIG. 1B.

FIG. 3C is an enlarged view of the portion "C1" and illustrates the mask adjustment for a next laser beam irradiation. In order to grow the grains, the mask 38 moves (relative to the amorphous silicon) to a position where the slit(s) "A" exposes a portion of the grain region "G1a," the border "H1," and the grain region "G1b." Namely, when the width of the first grain regions "G1a" and "G1b" is 2 micrometers ($\mu m$), the slit "A" of the mask moves by 0.7 micrometers ($\mu m$) in a transverse direction (i.e., in the x-axial direction). Then, a second laser beam irradiation is conducted to grow grains formed by the first laser beam irradiation, thereby resulting in grains 58c as shown in FIG. 3D.

FIG. 3D illustrates a partially crystallized amorphous silicon film after the second laser beam irradiation. During the second laser beam irradiation, the second laser beam irradiates portions of the first grain regions "G1a" and "G1b" and previously unexposed amorphous silicon. The regions irradiated by the second laser beam are melted and crystallized, thereby defining second grain regions "G2a" and "G2b," and a second border "H2" thereof. During that time, the grains 58a generated by the first laser beam irradiation serve as seeds for the second crystallization. Thus, the grains 58c are formed by lateral grain growth of the grains 58a in the second melted regions. Namely, the silicon grains 58c formed by the second laser beam irradiation continue to grow along the silicon grains 58a formed by the first laser beam irradiation. Meanwhile, new silicon grains 58d are grown from a newly formed interface 56c. The lateral growth of the grains 58c and 58d stop when they collide with each other at a line 50b of the second border "H2".

Accordingly, by repeating the steps of melting and crystallizing, one block of the amorphous silicon film is fully crystallized to form grains 58e as shown in FIG. 3E. Furthermore, the amorphous silicon film is converted into crystalline silicon film by block-by-block crystallization. Namely, the above-mentioned crystallization processes conducted within one block are repeated block by block across the amorphous silicon film. Therefore, the large amorphous silicon film is converted into a crystalline silicon film.

While generally successful, the conventional SLS method described above has disadvantages. Although the conventional SLS method produces relatively large size grains, the X-Y stage or the mask must repeatedly move a few micrometers to induce lateral grain growth. Therefore, the time required to move the X-Y stage or the mask 38 occupies a major part of the overall process time. This significantly decreases manufacturing efficiency.

To reduce the process time, a mask having closely spaced slits is often used. When a mask has a shorter distance between adjacent slits the mask can have more slits per unit area. Therefore, such a mask can reduce the number of laser beam shots and can increase productivity. However, a mask having closely spaced slits limits the grain length that can be achieved. This can reduce the suitability of the resulting crystalline silicon film for the active layer of driving devices, such as data driving circuits and gate driving circuits. However, crystalline silicon film formed by masks having closely spaced slits can still be useful for active layers of LCD panel switching devices (such as TFTs). This is because short grains (i.e., less than 1 micrometer) are still useful in such applications.

Accordingly, when forming TFT active layers, masks having closely spaced slits are usually used to reduce the overall processing time. However, when forming active layers for driving devices a mask having wider spaced slits are usually required. Thus, two masks, one for the TFTs and one for the driving circuits, are beneficial in some applications.

The masks for driving circuits have a relatively small number of slits per unit area. Furthermore, to make large grains the laser beam patterns of the second laser beam irradiation are required to overlap the center of the grain regions "G1a" and "G1b" that were formed by the first laser beam irradiation (reference FIG. 3C). However, the masks for TFTs have a relatively large number of slits per unit area. Therefore, the process time of forming the TFT active layer is relatively small (the grain size is smaller than in the driving circuit).

In the conventional art, let us suppose that the mask moves a distance of 0.7 micrometers, i.e., the translation distance is 0.7 micrometers. Further, let us suppose that the length of the lateral grain growth is about 1.2 micrometers and that the slit width is 2 micrometers. Further assume that the distance between adjacent slits is 10 micrometers. Under these assumptions the laser beam will be shot about 16 times to crystallize one block. This process time is relatively long and the manufacturing efficiency is low.

Alternatively, if the distance between adjacent slits is 4 micrometers, the laser beam will be shot about 9 times to crystallize one block. Although the number of laser beam irradiation decreases, the resulting grains are smaller and the crystalline silicon film has more larger grain boundaries. These grain boundaries interrupt the carrier movement and decrease the carrier mobility. Therefore, such small grains are usually not adequate for driving circuits. Therefore, another mask for forming the crystalline silicon active layer adequate to the driving circuit is required. Using the different mask for the driving circuit, however, causes increasing the cost of production.

Therefore, a new method of crystallizing amorphous silicon using sequential lateral solidification (SLS) such that both TFTs and driving circuit active layer materials are formed at the same time and with improved manufacturing efficiency would be beneficial.

SUMMARY OF THE INVENTION

Accordingly, the present invention is directed to a method of crystallizing an amorphous silicon film using a sequential lateral solidification (SLS) that substantially obviates one or more of problems due to limitations and disadvantages of the related art.

An advantage of the present invention is to provide a sequential lateral solidification (SLS) method which uses only one mask whatever for the TFTs and driving circuits such that it saves time in crystallizing an amorphous silicon film and obtain a productivity increase.

Another advantage of the present invention is to provide a method of crystallizing an amorphous silicon layer with increased manufacturing yield using the improved SLS method.

Additional features and advantages of the invention will be set forth in the description which follows, and in part will be apparent from the description, or may be learned by practice of the invention. The objectives and other advantages of the invention will be realized and attained by the method particularly pointed out in the written description and claims hereof as well as the appended drawings.

To achieve these and other advantages and in accordance with the purpose of the present invention, as embodied and broadly described, a method of crystallizing an amorphous silicon film using a mask that includes a light absorptive portion for blocking a laser beam and a plurality of Y-axially stripe-shaped light transmitting portions for passing the laser beam is provided. The method includes locating a substrate having an amorphous silicon film in a sequential lateral solidification (SLS) apparatus; dividing the amorphous silicon film into a driving region where driving devices are to be located and a display region where thin film transistors are to be located. Then, irradiating the driving region using a laser beam that passes through the mask such that laterally grown grains are formed that correspond to the Y-axially stripe-shaped light transmitting portion of the mask, wherein those laterally grown grains form a first grain region, a second grain region and a first middle section between the first and second grains regions. Then, X-axially moving the mask relative to the substrate by a translation distance that is less than half the width of the Y-axially stripe-shaped light transmitting portions and such that each of the Y-axially stripe-shaped light transmitting portion exposes a portion of the first grain region, the first middle section and the second grain region. Then, performing a second crystallization on the driving region such that the grains grow in second irradiated portions of the driving region, and irradiating the display region using a laser beam that passes through the mask such that the laterally grown grains are formed in the irradiated display region that corresponds to the Y-axially stripe-shaped light transmitting portion of the mask, wherein the laterally grown grains form a third grain region, a fourth grain region and a second middle section between the third and fourth grains regions. Then, X-axially moving the mask relative to the substrate by a translation distance that is more than half the width of the Y-axially stripe-shaped light transmitting portions and such that each of the Y-axially stripe-shaped light transmitting portion exposes a portion of the fourth grain region. Also, performing a second crystallization on the display region such that laterally growing grains grow in the second irradiated portions of the display region.

The method of crystallizing the amorphous silicon film further includes X-axially moving the mask a plurality of times to complete the X-axis directional crystallization, and then moving the mask in the Y-axial direction by the length of light transmitting portions after the amorphous silicon film is crystallized in the X-axial direction. Also, conducting a second X-axis directional crystallization after moving the mask in the Y-axial direction a translation distance that is less than half the width of the Y-axially stripe-shaped light transmitting portions (0.5 to 0.8 micrometers), while the translation distance is more than half the width of the Y-axially stripe-shaped light transmitting portions (1.6 to 1.8 micrometers). The length of lateral grain growth in the driving region of the amorphous silicon film is 10 to 13 micrometers, and the length of lateral grain growth in the display region of the amorphous silicon film is 1.5 to 3 micrometers. The width of the Y-axially stripe-shaped light transmitting portions of the mask is less than or equal to twice the maximum length of lateral grain growth that is to be grown by sequential lateral solidification (SLS). This width of the Y-axially stripe-shaped light transmitting portions of the mask is beneficially 2 micrometers. The distance between the Y-axially stripe-shaped light transmitting portions of the mask is about 10 micrometers. The length of the Y-axially stripe-shaped light transmitting portions of the mask is about 10 micrometers.

In another aspect of the present invention, a method of crystallizing an amorphous silicon film using a mask that includes a light absorptive portion for blocking a laser beam and a plurality of X-axially stripe-shaped light transmitting portions for passing the laser beam. The method includes locating a substrate having an amorphous silicon film in a sequential lateral solidification (SLS) apparatus; dividing the amorphous silicon film into a driving region where driving devices are located and a display region where thin film transistors are located, and then irradiating the driving region using a laser beam that passes through the mask such that laterally grown grains are formed in the irradiated driving region and that corresponds to the X-axially stripe-shaped light transmitting portion of the mask, wherein laterally grown grains form a first grain region, a second grain region and a first middle section between the first and second grains regions. Then, X-axially moving the mask a plurality of times by the length of X-axially stripe-shaped light transmitting portions to complete the X-axis directional crystallization in the driving region of the amorphous silicon film. Then, Y-axially moving the mask relative to the substrate by a translation distance that is less than half the width of the X-axially stripe-shaped light transmitting portions after the driving region is crystallized in the X-axial direction and such that each of the X-axially stripe-shaped light transmitting portion exposes a portion of the first grain region, the first middle section and the second grain region. Then, performing a second X-axial directional crystallization on the driving region such that laterally growing grains grow in irradiated portions of the driving region. Then, irradiating the display region using a laser beam that passes through the mask such that the laterally grown grains are formed in the irradiated display region that corresponds to the X-axially stripe-shaped light transmitting portion of the mask, wherein laterally grown grains form a third grain region, a fourth grain region and a second middle section between the third and fourth grains regions. Then, X-axially moving the mask a plurality of times by the length of X-axially stripe-shaped light transmitting portions to complete the X-axis directional crystallization in the display region of the amorphous silicon film. Then, Y-axially moving the mask relative to the substrate by a translation distance that is more than half the width of the X-axially stripe-shaped light transmitting portions and such that each of the X-axially stripe-shaped light transmitting portions expose a portion of the fourth grain region. Then, performing a second X-axis directional crystallization to the display region such that laterally growing grains grow in irradiated portions of the display region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings:

FIGS. 3A to 3E are plan views showing one block of an amorphous silicon film during crystallization using a conventional SLS method;

FIGS. 6A to 6D are plan views showing the crystallization of an amorphous silicon film that is to be used for a driving circuit and that uses the mask shown in FIG. 5;

FIGS. 7A to 7D are plan views showing the crystallization of an amorphous silicon film that is to be used for TFTs and that uses the mask shown in FIG. 5;

FIGS. 9A to 9E are plan views showing the crystallization of an amorphous silicon film that is to be used for TFTs and that uses the mask shown in FIG. 8;

FIGS. 10A to 10E are plan views showing the crystallization process steps of an amorphous silicon film for the TFTs using the mask shown in FIG. 8 according to the second embodiment of the present invention;

DETAILED DESCRIPTION OF THE ILLUSTRATED EMBODIMENTS

Reference will now be made in detail to the preferred embodiments of the present invention, examples of which are shown in the accompanying drawings. Wherever possible, similar reference numbers will be used throughout the drawings to refer to the same or like parts.

Figure 4:
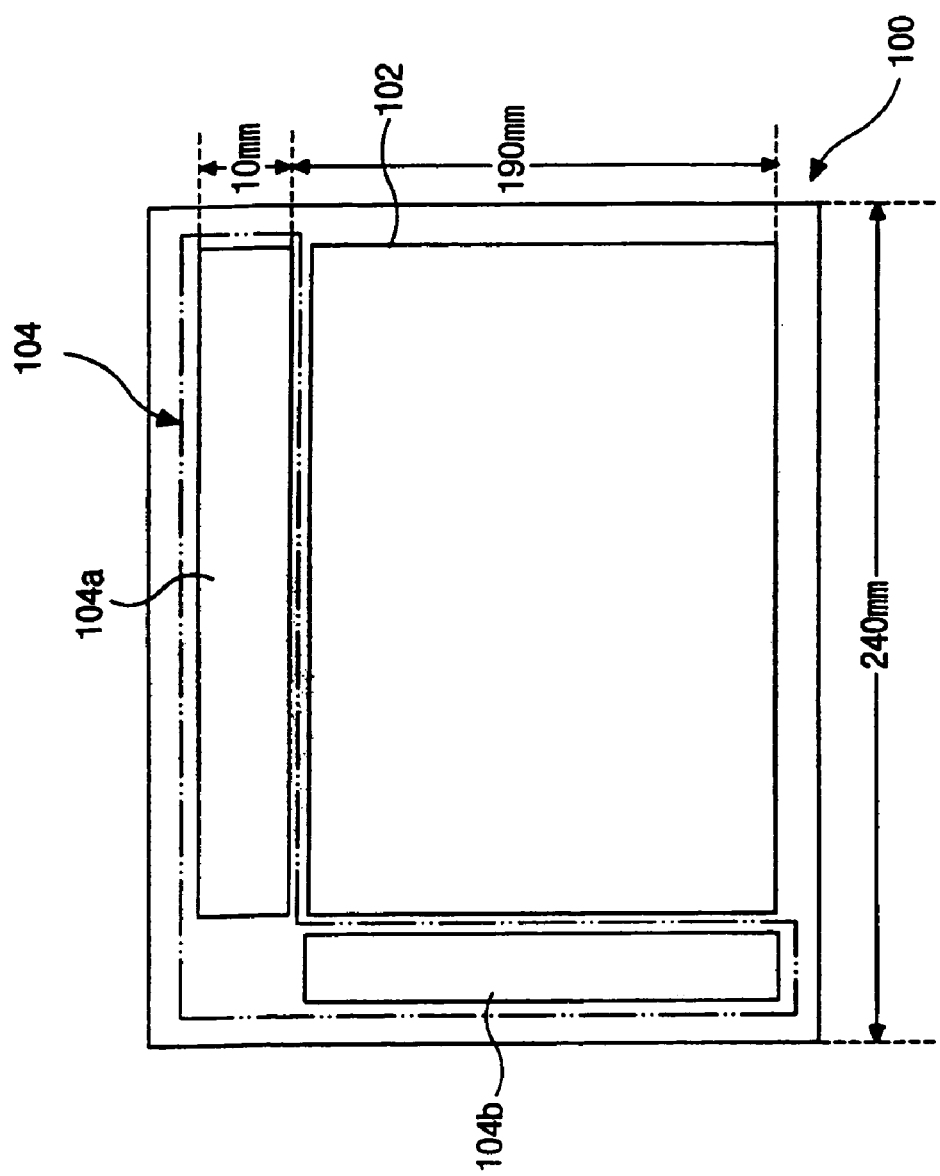
FIG. 4 is a schematic view of a liquid crystal display panel, including a data driving circuit and a gate driving circuit, having active layers crystallized according to the principles of the present invention.

FIG. 4 is a schematic view of a liquid crystal display panel that includes a data driving circuit and a gate driving circuit, both of use crystalline active layers fabricated according to the principles of the present invention. For example, the liquid crystal display panel could have a width of 240 millimeters (mm) and a length of 200 millimeters (mm), and each of gate and driving circuits might have a width of 10 micrometers. As shown in FIG. 4, the liquid crystal panel 100 includes a display region 102 and a driving region 104 that is comprised of a data driving circuit 104a and the gate driving circuit 104b. In the display region 102 are a plurality of switching devices, i.e., thin film transistors (TFTs). The data driving circuit 104a and the gate driving circuit 104b include a plurality of CMOS (Complementary Metal Oxide Semiconductor) devices.

The CMOS devices of the driving circuits 104a and 104b require fast carrier mobility, whereas the carrier mobility of the TFTs in the display region 102 does not have to be fast as much as that of the CMOS. Although the TFTs have relatively slow carrier mobility, they show sufficient operating characteristics.

In the present invention, when crystallizing the amorphous silicon for the CMOS devices and TFTs, the same mask is used, but the translation distance depends on whether the active layer being formed is for the CMOS device or for the TFT.

Figure 5:
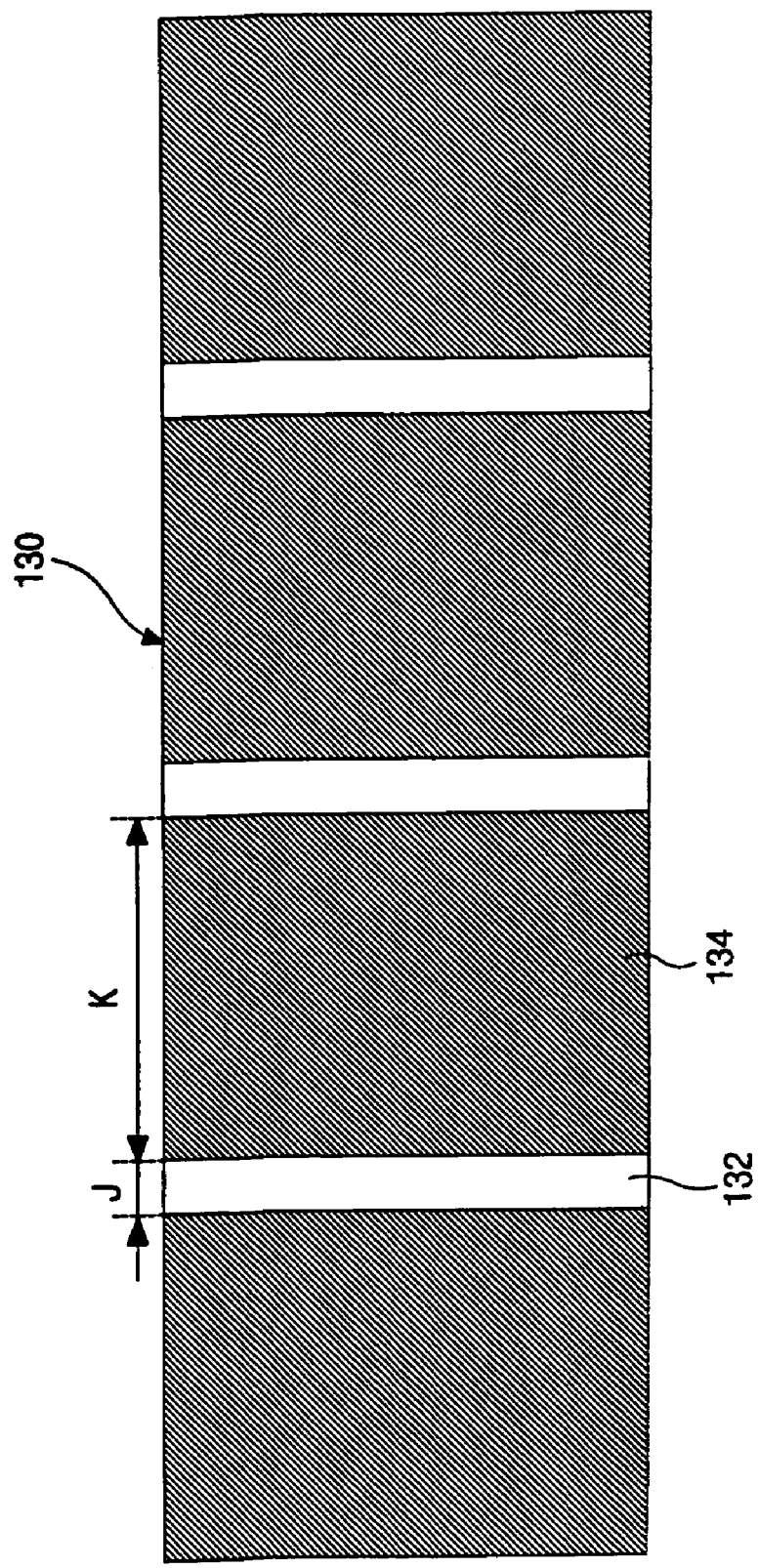
FIG. 5 is a plan view of a mask 130 that is used in a SLS method according to a first embodiment of the present invention.

FIG. 5 is a plan view of a mask 130 that is used in a SLS method according to a first embodiment of the present invention. The mask 130 has light transmitting portions 132 and light absorptive portions 134. The width "J" of the transmitting portions 132 is 2 micrometers and the width "K" of the light absorptive portions 134 is 10 micrometers. When crystallizing amorphous silicon for the CMOS devices using a ten micrometers square (10×10 $\mu m^2$) block, the mask 130 translation distance is 0.7 micrometers. Laser beam irradiation is performed about 16 times per block. The result is grains having a length of about 12 micrometers. However, when crystallizing amorphous silicon for the TFTs, the mask 130 translation distance is 1.7 micrometers. Laser beam irradiation is performed about 7 times per block. The result is grains having a length of about 1.7 micrometers.

Referring to FIGS. 4 and 5, when crystallizing the driving region 104 to form 12 micrometers long grains using the mask 130, the number of laser beam shots will be about 384, found from the equation, (240/10)×16=384. Additionally, when crystallizing the display region 102 to form 1.7 micrometers long grains the number of laser beam shots will be about 3059, found from the equation, {[(240−10)/10]× 19}×7=3059. On the other hand, if the amorphous silicon film was crystallized to produce 12 micrometer long grains using a translation distance of 0.7 micrometers, the laser beam would have to be shot 7680 times, found from the equation, [(240/10)×20]×16=7680. Thus, using only a translation distance of 0.7 micrometers increases the required number of laser beam shots as much as 2.51 times. As a result, using different translation distances in the display region and in the driving region reduces the beam processing time, even when only a single mask is used.

Figure 6D:
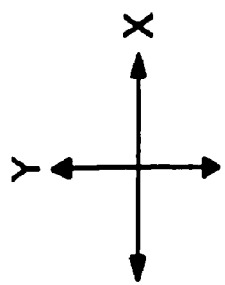
Figure 6D:
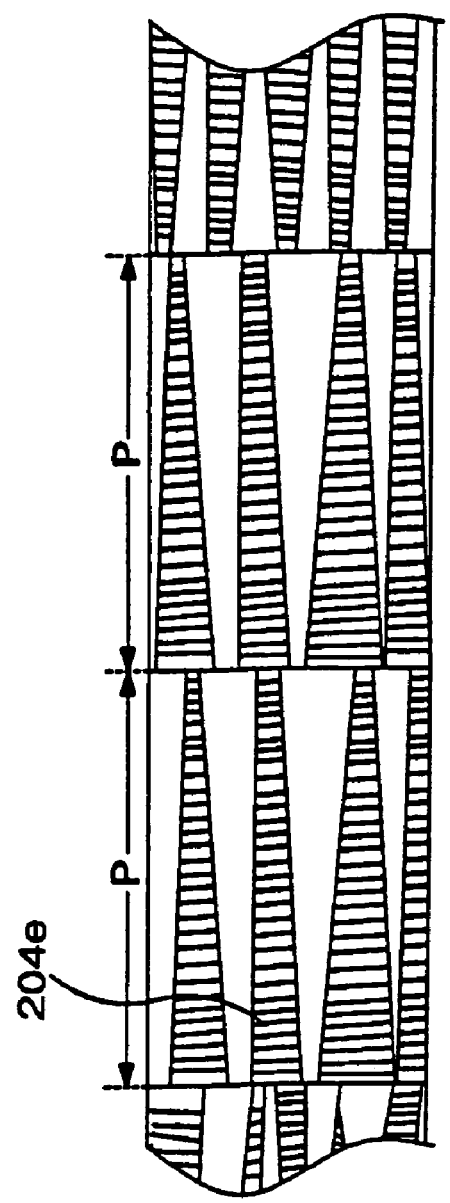

FIGS. 6 and 7 will be used to explain the crystallization processes for CMOS devices and TFTs. FIGS. 6A to 6D are plan views of a first embodiment process of crystallizing amorphous silicon film for driving circuits when using the mask shown in FIG. 4. In the illustrated crystallization process it will be assumed that the mask 130 has three light transmitting portions.

FIG. 6A shows the initial step of crystallizing an amorphous silicon film 200 using a first laser beam irradiation. As described with reference to FIG. 1A, the laser beam 34 passes through the mask 130 (which replaces the mask 38) and irradiates one block of the amorphous silicon film 200. The laser beam is divided into three line beams by the three light transmitting portions 132. The three line beams irradiate and melt regions of the amorphous silicon film 200. The energy density of the line beams should be sufficient to induce complete melting of the amorphous silicon film 200. That is, the portion of the amorphous silicon film that is irradiated by the laser beam 34 is completely melted.

Still referring to FIG. 6A, after complete melting, the liquid phase silicon begins to crystallize at interfaces 202a and 202b of the solid phase amorphous silicon and the liquid phase silicon. Crystallization occurs such that grains grow laterally. Thus, as shown, lateral grain growth of grains 204a and 204b proceeds from the un-melted regions to the fully melted regions. Since the light transmitting portions 132 is 2 micrometers wide the lateral grain growth stops when the grains 204a and 204b collide at a middle section "M" of the melted regions. The grains 204a and 204b define first grain regions "L1" and second grain regions "L2," respectively. As previously discussed, the grain boundaries in directionally solidified silicon tend to form perpendicular to the interfaces 202a and 202b between the solid phase amorphous silicon and the liquid phase silicon.

FIG. 6B illustrates crystallizing the amorphous silicon film 200 of FIG. 6A using a second laser beam irradiation. After the first laser beam irradiation, the X-Y stage or the mask 130 moves along the lateral grain growth of the grains 204a or 204b (see FIG. 6A), i.e., in the X direction, by a distance of about 0.7 micrometers. Therefore, each of the light transmitting portions of the mask 130 exposes a portion of the first grain region "L1," the middle section "M" and the second grain region "L2." Additionally, new amorphous silicon regions "O" are also exposed. During the second laser beam irradiation, these exposed regions are melted and crystallized, thereby resulting in larger grains 204c as shown in FIG. 6C. The grains 204a produced by the first laser beam irradiation act as seeds for the second crystallization such that the grains 204c formed by the second laser beam irradiation continue to grow along from the silicon grains 204a. Further, silicon grains 204d that are grown from an interface 202c are also formed. The lateral growth of these grains 204c and 204d stops when they collide in a middle section of the silicon region melted by the second laser beam irradiation.

Accordingly, by repeating the foregoing steps of melting, crystallizing, and moving the mask 130 one block of the amorphous silicon film is crystallized to form grains 204e as shown in FIG. 6D. Since the foregoing steps are repeated till the mask moves the distance between adjacent light transmitting portions the grains 204e have a width "P" of 12 micrometers.

FIGS. 7A to 7D are plan views showing the crystallization process of an amorphous silicon film that is used for TFTs and that is crystallized using the mask 130 shown in FIG. 5 according to the first embodiment of the present invention. In the illustrated crystallization, it should be understood that the mask 130 has three light transmitting portions.

Figure 7A:
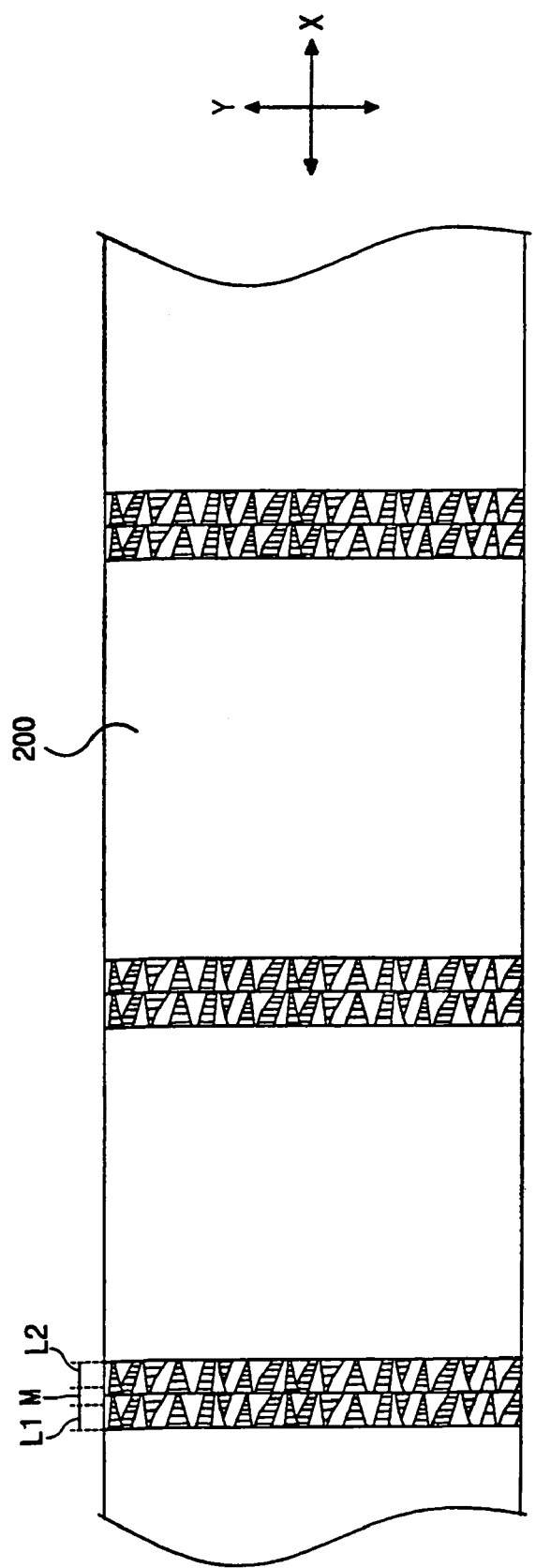

FIG. 7A shows the initial step of crystallizing an amorphous silicon film 200 using a first laser beam irradiation. Since the initial steps for crystallizing amorphous silicon for TFTs is similar to that for the driving circuits (reference FIG. 6A) some detailed explanation is omitted. Since the light transmitting portions "J" of the mask have a width of 2 micrometers, a first grain region "L1," a middle sections "M" and a second grain region "L2" are formed by each line beam by the first laser beam irradiation. As previously mentioned, the grains of the first and second grain regions "L1" and "L2" have grain boundaries that extend perpendicularly from the interfaces between crystalline silicon and amorphous silicon.

Figure 7B:
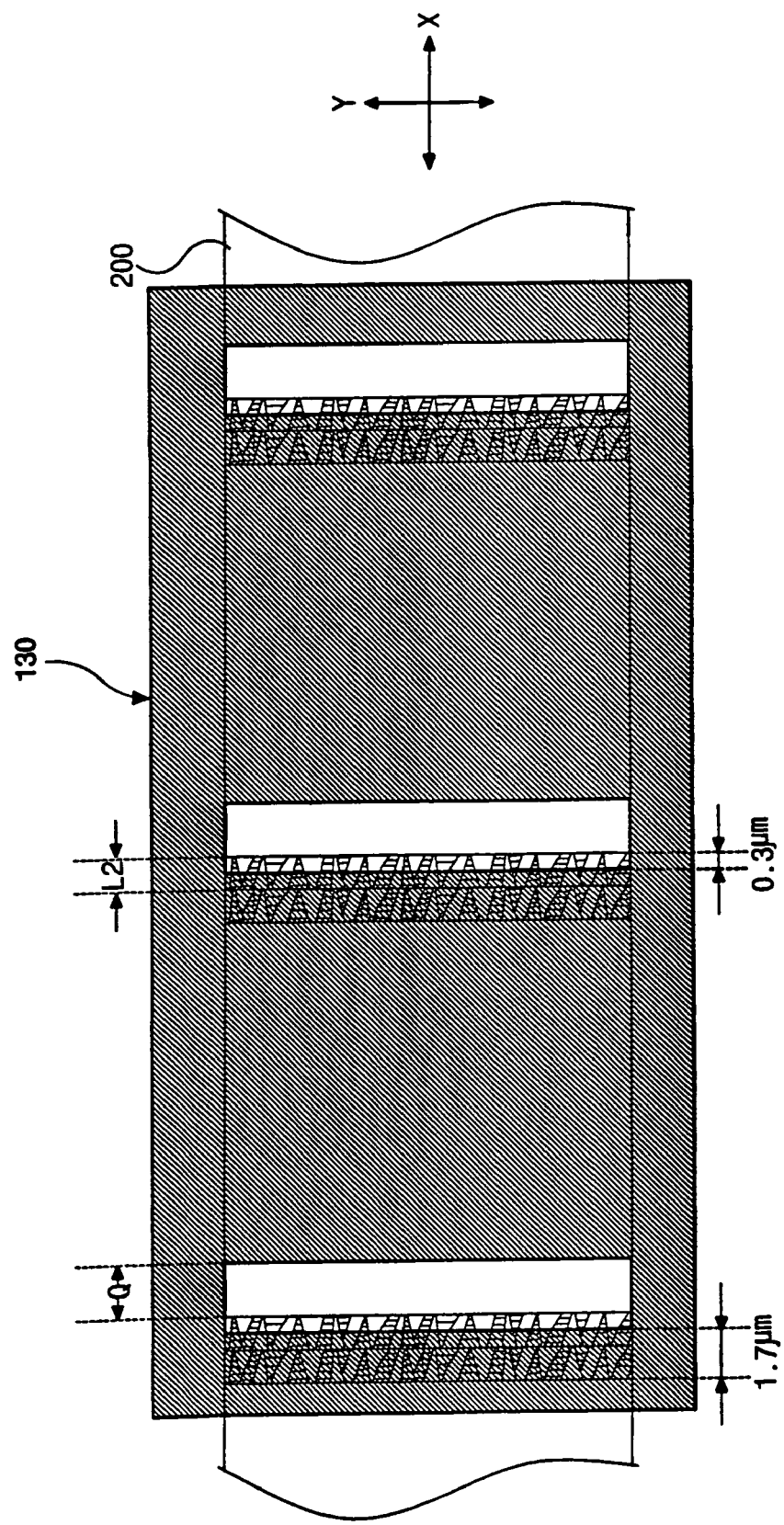

FIG. 7B illustrates crystallizing the amorphous silicon film 200 of FIG. 7A using a second laser beam irradiation. After the first laser beam irradiation, the X-Y stage or the mask 130 moves in the X-axial direction by a distance of about 1.7 micrometers. Therefore, each of the light transmitting portions of the mask 130 exposes a portion of the second grain region "L2" and a new amorphous silicon region "Q." Since the mask 130 moves by 1.7 micrometers in the X-axial direction, the exposed portions of the second grain region "L2" are 0.3 micrometers, while the exposed new amorphous silicon regions "Q" have a width of 1.7 micrometers that is the same as the translation distance. During the second laser beam irradiation, these exposed regions are melted and crystallized, thereby resulting in larger grain regions "R" as shown in FIG. 7C.

At this time the grains of the second grain region "L2" serve as seeds for the second crystallization such that the grains of the large grain regions "R" of FIG. 7C continue to grow along the grains of the second grain region "L2." Further, silicon grains grown from a new interface are also formed in a third grain region "L3" as shown in FIG. 7C. As previously mentioned, the lateral growth of grains stops in the second crystallization where the grains collide in a middle section of the silicon region melted by the second laser beam irradiation. Accordingly, still referring to FIG. 7C, the large grain regions "R" have a width of 1.7 micrometers and the first and third grain regions "L1" and "L3" have a width of 1 micrometer. That is, the grains of the large grain regions are 1.7 micrometers in length, and the grains of the first and third grain regions "L1" and "L3" are 1 micrometer in length.

Figure 7D:
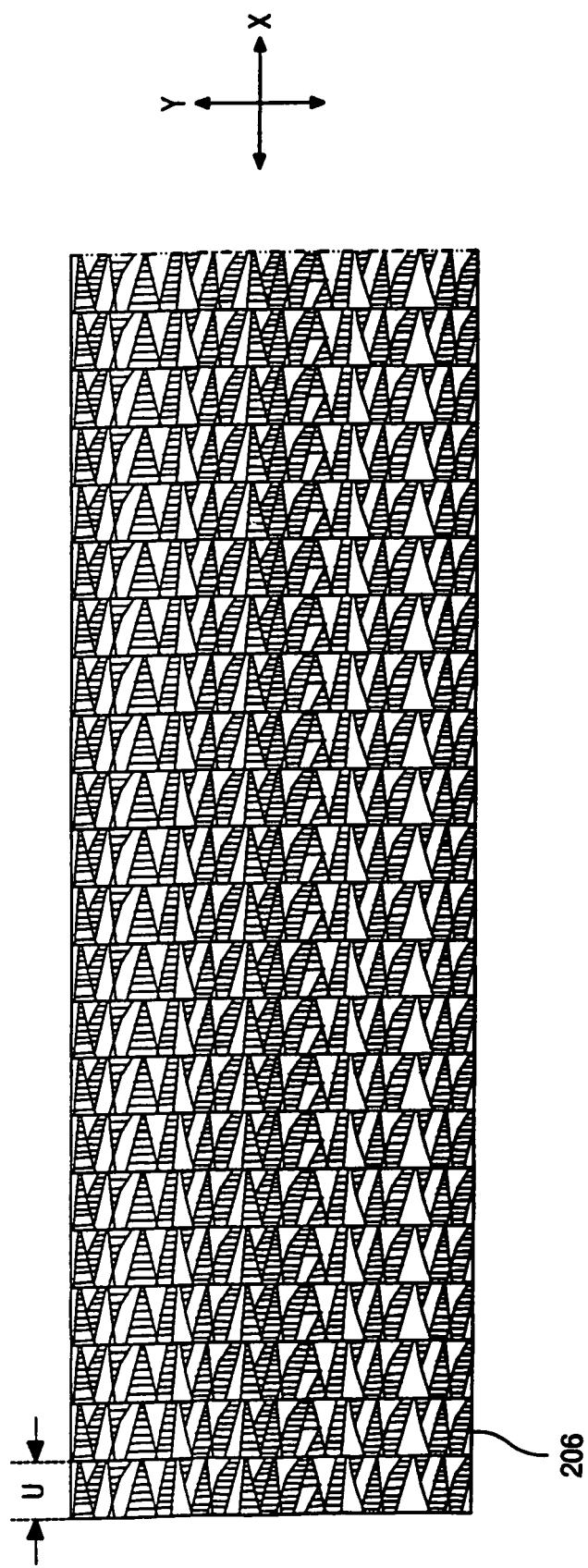

Accordingly, by repeating the foregoing steps of moving, melting, and crystallizing, one block of the amorphous silicon film is crystallized to form grains 206 as shown in FIG. 7D. Each grain 206 has a width "U" of 1.7 micrometers.

The crystallizing process for the TFTs illustrated in FIGS. 7A to 7D forms grains having relatively short grain sizes, but significantly reduces the crystallization process time. Although the grains 206 for the TFTs are only 1.7 micrometers in length, they are sufficient for the active layers of the TFTs because the crystallized silicon has a carrier mobility good enough to TFTs. In fact, as is widely known, grains having a length of 1 micrometer have sufficient carrier mobility for TFTs.

Figure 8:
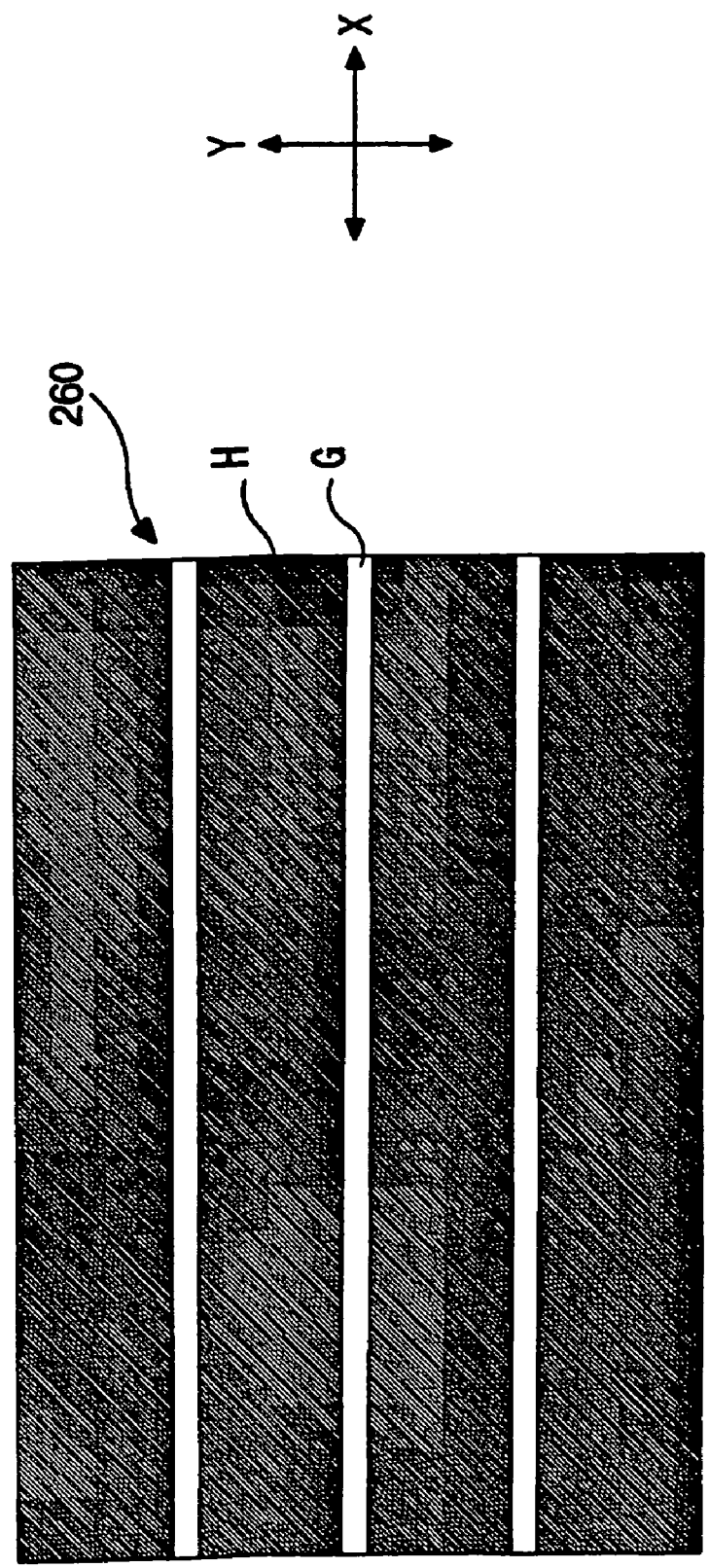
FIG. 8 is a plan view of a mask 260 that is used in a SLS method according to a second embodiment of the present invention.

FIG. 8 is a plan view of a mask 260 that is used in an SLS method according to a second embodiment of the present invention. The mask 260 has light transmitting portions "G" that are transversely stripe-shaped, and light absorptive portions "H" that are located between the stripe-shaped light transmitting portions "G." The width of the light transmitting portions "G" is about 2 micrometers, and the width of the light absorptive portions "H" is about 10 micrometers. As described with reference to FIG. 1A, the laser beam 34 passes through the mask (now the mask 260) and irradiates the amorphous silicon film on the substrate. The laser beam 34 is divided into three line beams by the three light transmitting portions "G" of the mask 260. Those line beams are reduced by the objective lens 42 to create beam patterns on the amorphous silicon film. When crystallizing the amorphous silicon film using the mask 260, the laterally grown grains from the sides collide with each other to form a border at a middle section of the molten region. In the second embodiment of the present invention, the beam patterns formed by the mask 260 move in a transverse direction, i.e., an X-axial direction, as crystallization proceeds. Namely, the mask 260, for example, moves as much as its width, so crystallization is conducted along the length of the beam pattern. Since the X-Y stage or the mask 260 moves in the X-axial direction by the mask width, such as several hundred micrometers (μm) to several millimeters (mm), this movement reduces processing time when compared to the SLS method described with reference to FIGS. 3A to 3E.

FIGS. 9A to 9D are plan views showing the crystallization process of an amorphous silicon film that is to be used for a driving circuit and that uses the mask 260. In the illustrated crystallization, it is assumed that the mask 260 has three light transmitting portions.

Figure 1A:
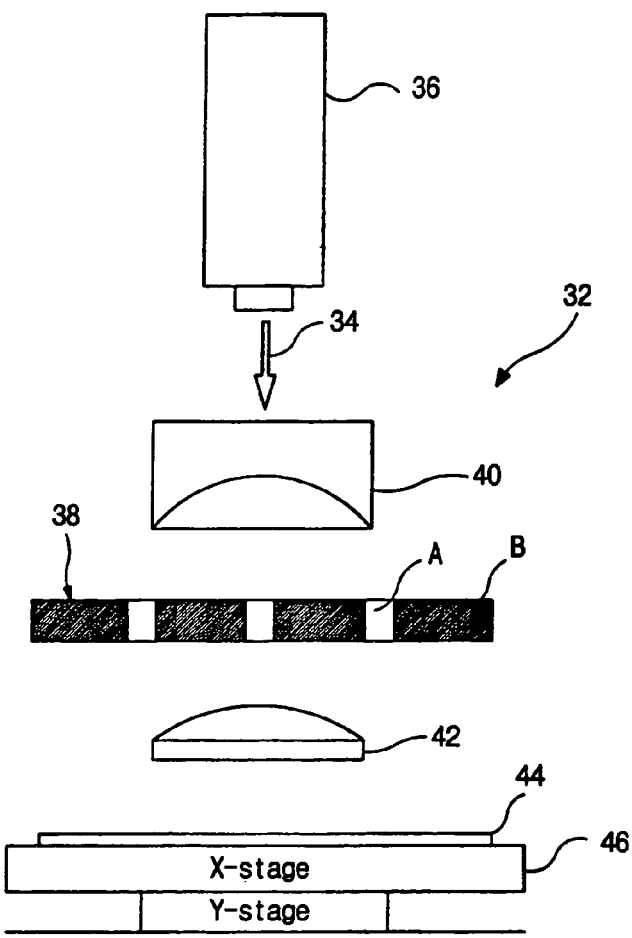
FIG. 1A is a schematic configuration of a sequential lateral solidification (SLS) apparatus according to the conventional art.
Figure 1B:
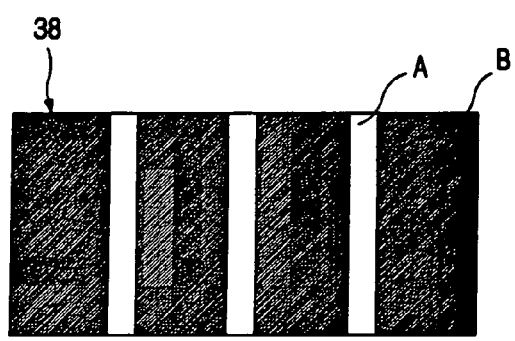
FIG. 1B is a plan view showing a mask used in the apparatus of FIG. 1A.
Figure 2:
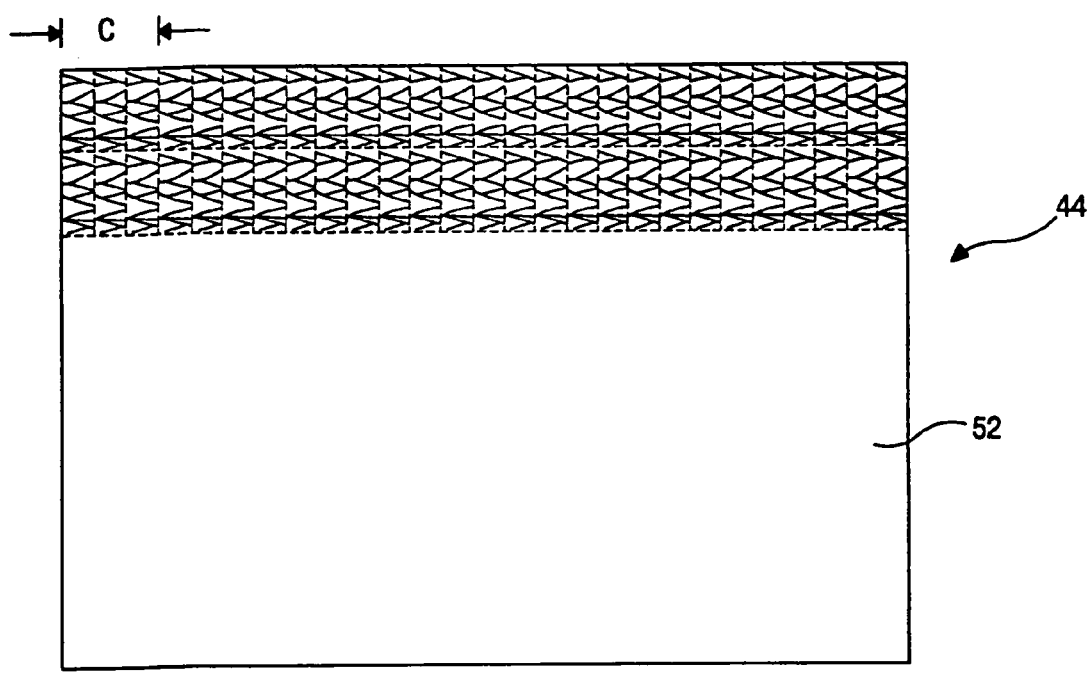
FIG. 2 is a plan view showing a substrate having a partially-crystallized amorphous silicon film.
Figure 3A:
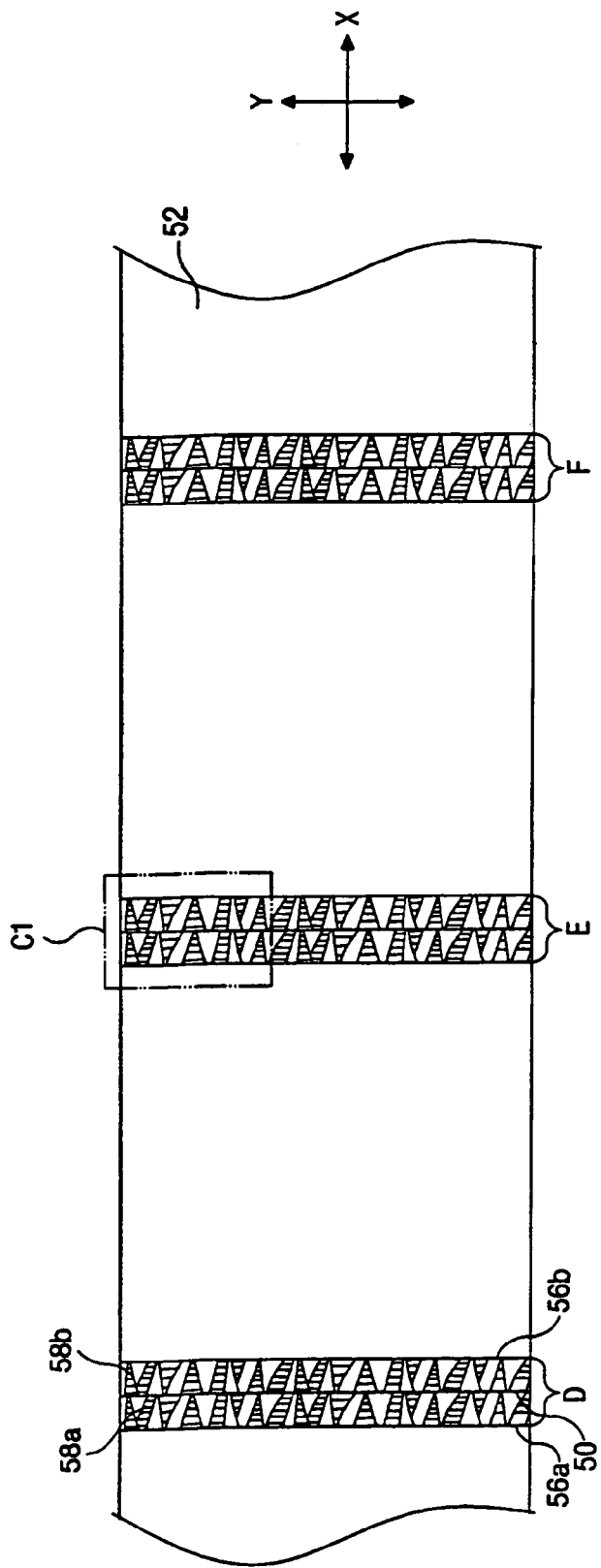
Figure 3B:
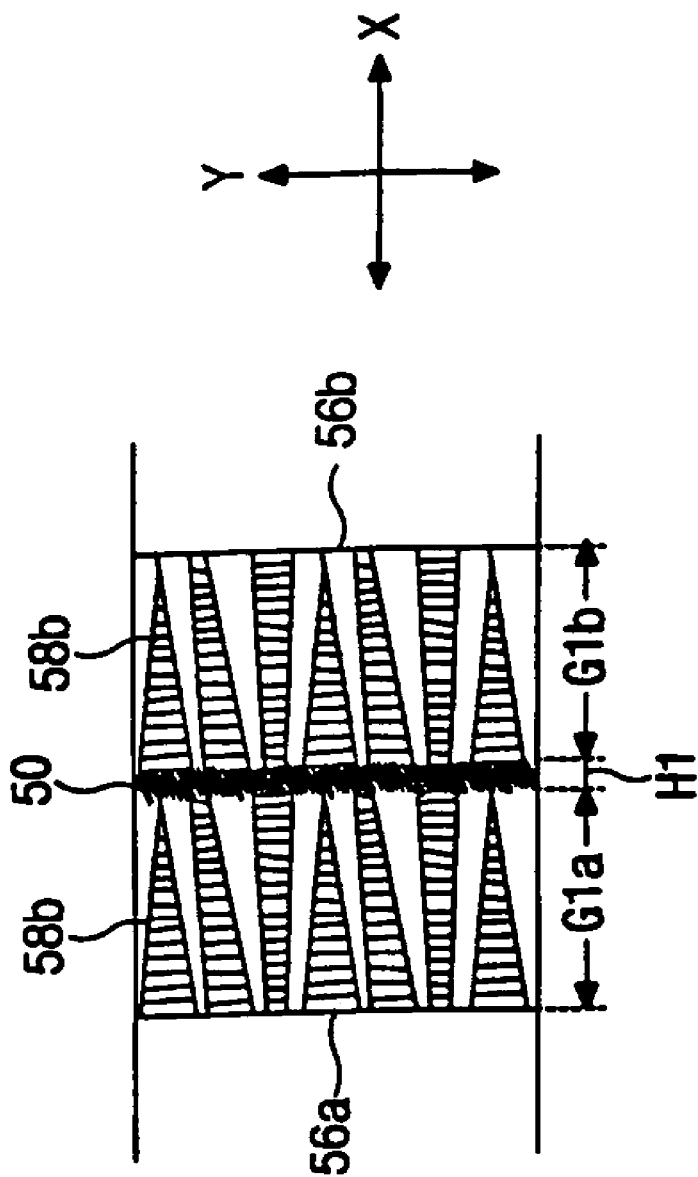
Figure 3C:
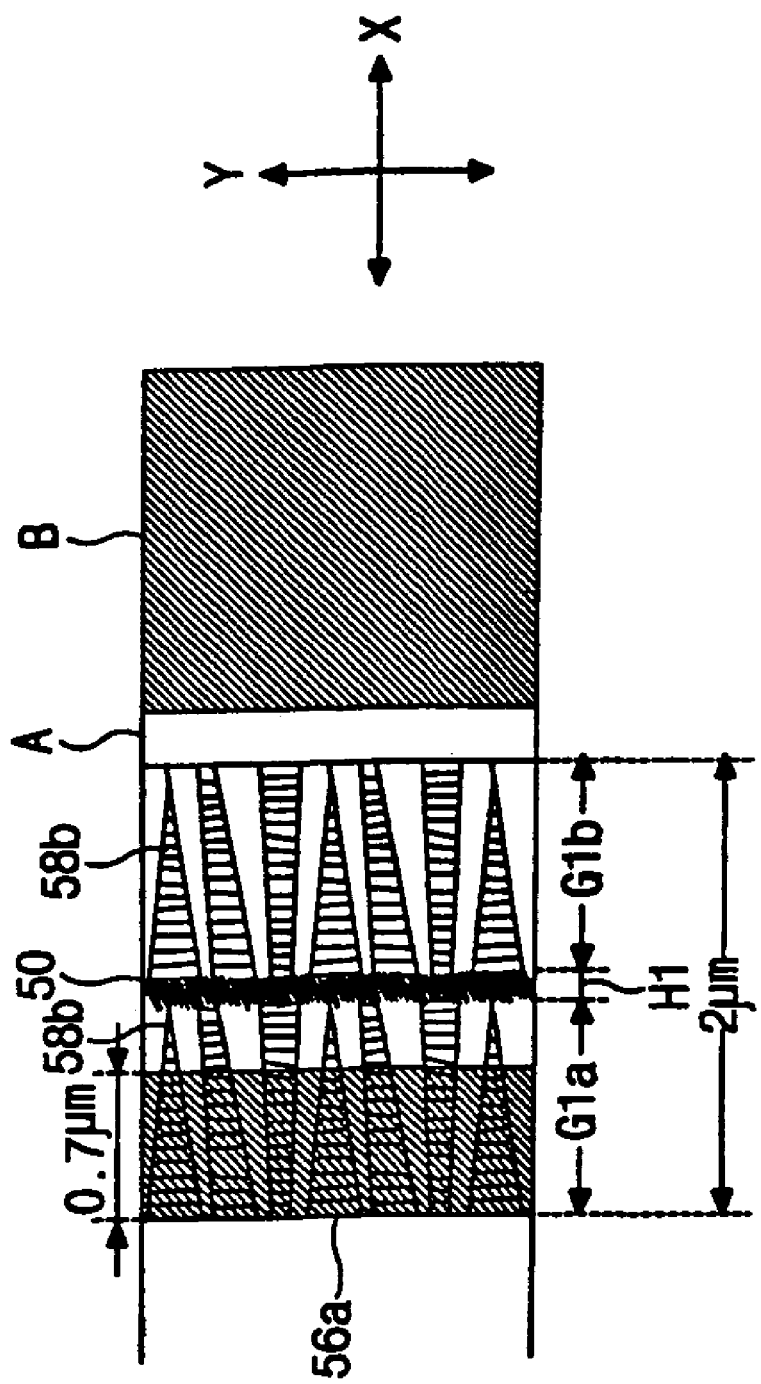
Figure 3D:
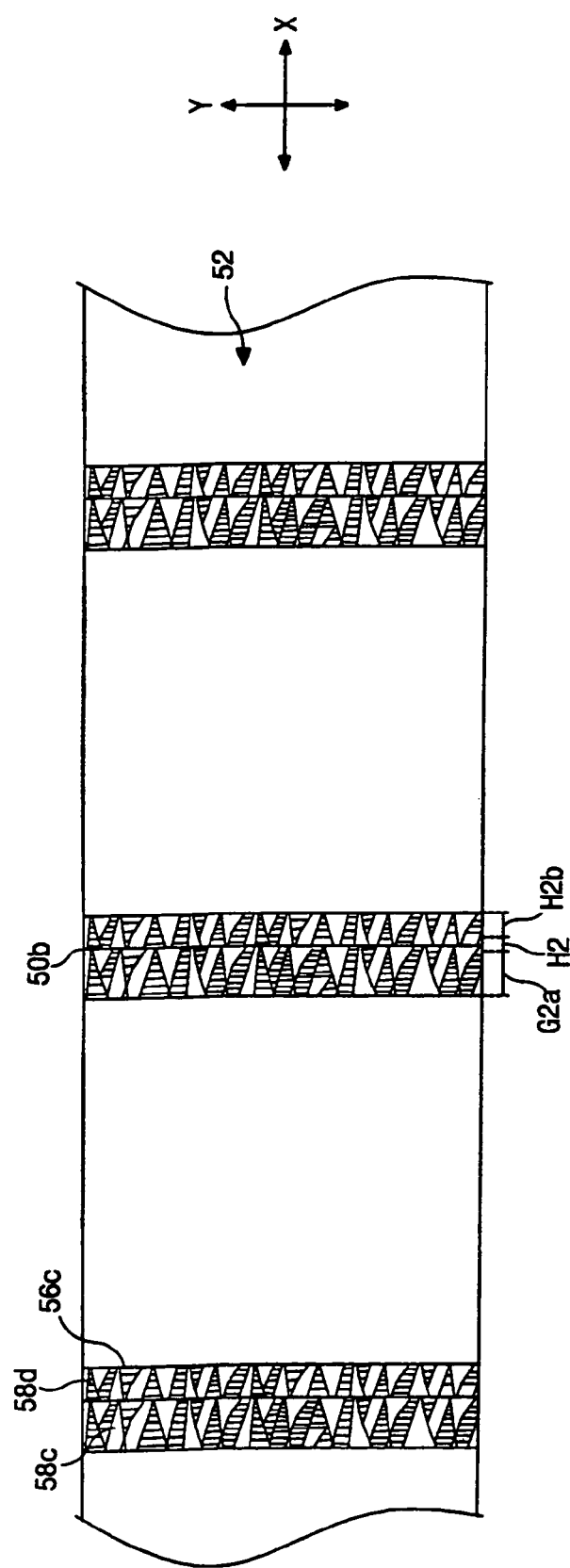
Figure 9A:
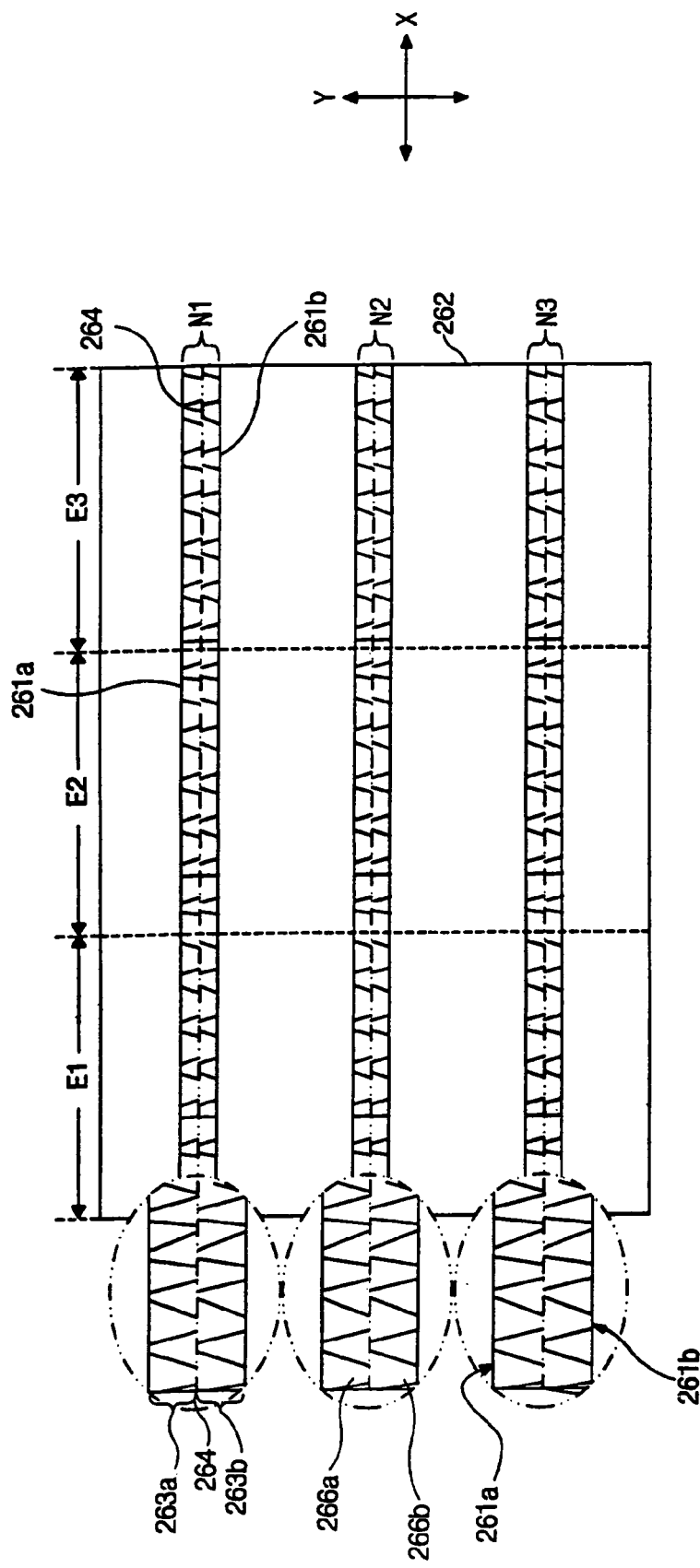

FIG. 9A shows an initial step of crystallizing the amorphous silicon film. Referring to FIGS. 1A and 9A, the laser beam 34 from the laser generator 36 passes through the mask 260 (which replaces the mask 38) and irradiates a first block $E_1$ of an amorphous silicon film 262 deposited on the substrate. The laser beam 34 is divided into three line beams by the light transmitting portions "G." The three line beams irradiate and melt regions "N1," "N2," and "N3" of the amorphous silicon film 262. Since each of the melted regions "N1," "N2," and "N3" corresponds to a light transmitting portion "G," the width of the melted regions "N1," "N2," and "N3" is about 2 micrometers, which is less than twice the maximum lateral grain growth. The energy density of the line beams should be sufficient to induce complete melting of the amorphous silicon film, i.e., complete melting regime.

The liquid phase silicon begins crystallize at the interfaces 261a and 261b of the solid phase amorphous silicon and the liquid phase silicon. Namely, the lateral grain growth of the grains 266a and 266b proceeds from un-melted regions to fully melted regions. Then, lateral growth stops when the grains 266a and 266b collide in the middle 264 of the melted silicon region. The grain boundaries in the directionally solidified silicon tend to form perpendicular to the interfaces 261a and 261b of the solid phase amorphous silicon and the liquid phase silicon. As a result of the first laser beam irradiation, a first block $E_1$ is partially crystallized, and each of the crystallized regions "N1," "N2," and "N3" includes a first grain region 263a, a second grain region 263b, and the middle 264. Thereafter, by moving the mask 260 or the X-Y stage the beam patterns move in the X-axial direction by a distance of several millimeters (mm). Then, a second irradiation is conducted and the second block $E_2$ is partially crystallized. The crystallization in the X-axis direction is then repeatedly to crystallize a third block $E_3$ (and possibly other blocks).

As a result of the first to third laser beam irradiations, crystallized regions "N1," "N2," and "N3" are formed in the first to third blocks $E_1$, $E_2$ and $E_3$, each of which corresponds to the mask 260 of FIG. 8.

Figure 9B:
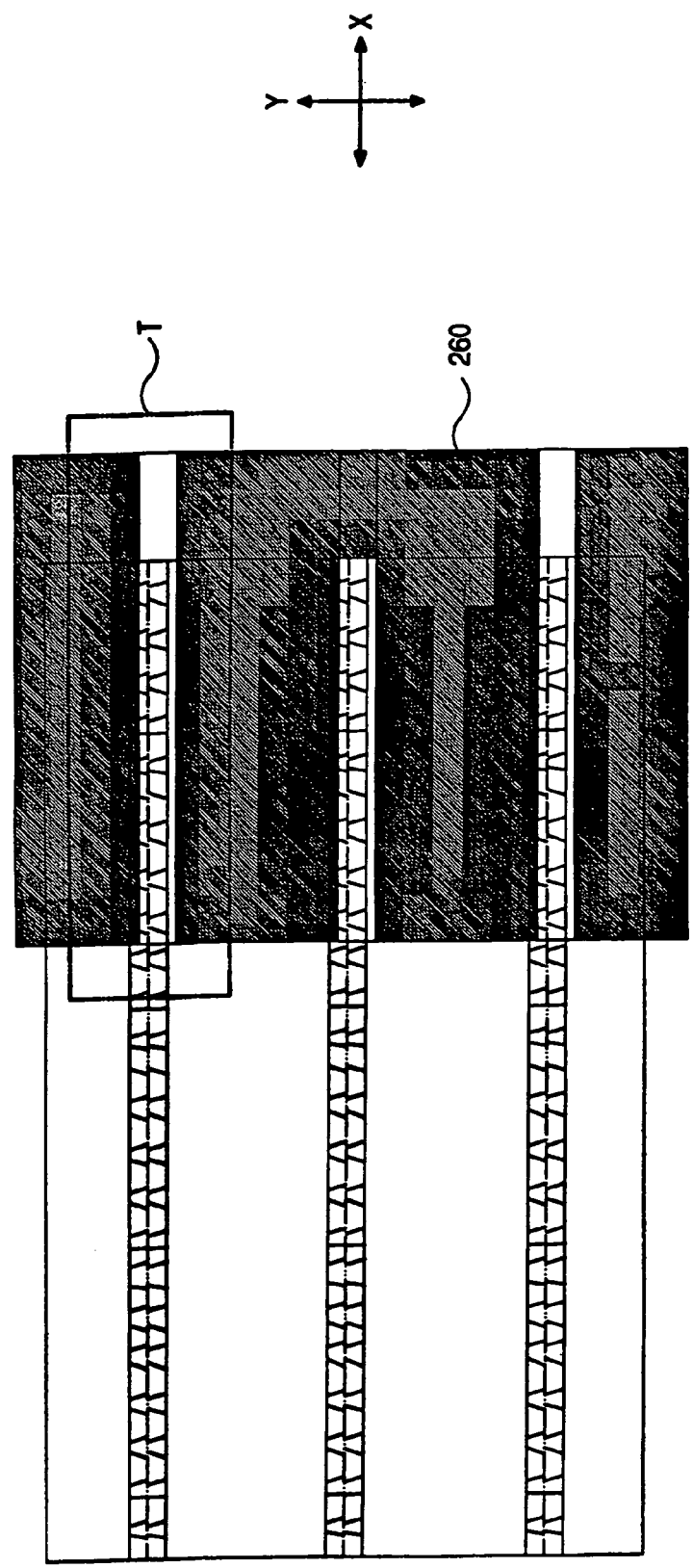

FIG. 9B is a plan view illustrating the mask adjustment for another amorphous silicon crystallization in an X-axial direction. FIG. 9C is an enlarged plan view of a portion "T" of FIG. 9B.

Referring to FIGS. 9B and 9C, after the first X-axial laser beam irradiations, the X-Y stage or the mask 260 moves in the Y-axial direction by a distance of about 0.7 micrometers. Then, crystallization is conducted block-by-block. Since the mask 260 moves in the Y-axial direction by 0.7 micrometers, the light transmitting portions of the mask 260 exposes a portion of the first grain region 263a, the middle 264, the second grain region 263b, and a new amorphous silicon region 265. Therefore, the regions irradiated by the laser beam are melted and then crystallized in the manner described with reference to FIG. 9A. The silicon grains 266a grown by the first to third laser beam irradiations serve as seeds for the new crystallizations, and thus the lateral grain growth proceeds in the Y-axial direction.

As a result, silicon grains 266c formed by sequential lateral solidification (SLS) continue to grow along the silicon grains 266a of FIG. 9C, reference FIG. 9D. The grown silicon grains 266c constitute a third grain region 270a. A fourth grain region 270b is formed by growing the silicon grains from an interface 261c. The third and fourth grain regions 270a and 270b border on each other at the middle 267. Accordingly, the first grain region 263a tends to extend.

Now referring to FIG. 9E, by repeating the foregoing steps of moving, melting and crystallizing, a silicon film having large grains 272 is finally formed. The width "S" of the grains 272 is about 12 micrometers, which substantially corresponds to the distance between the adjacent light transmitting portions of the mask. The large grains 272 formed by the second embodiment of the present invention are used in the active layer of the driving circuit.

FIGS. 10A to 10E are plan views showing the crystallization process steps of an amorphous silicon film that will be used for TFTs, with the process using the mask shown in FIG. 8. In the illustrated crystallization, it is assumed that the mask 260 has three light transmitting portions.

Figure 10A:
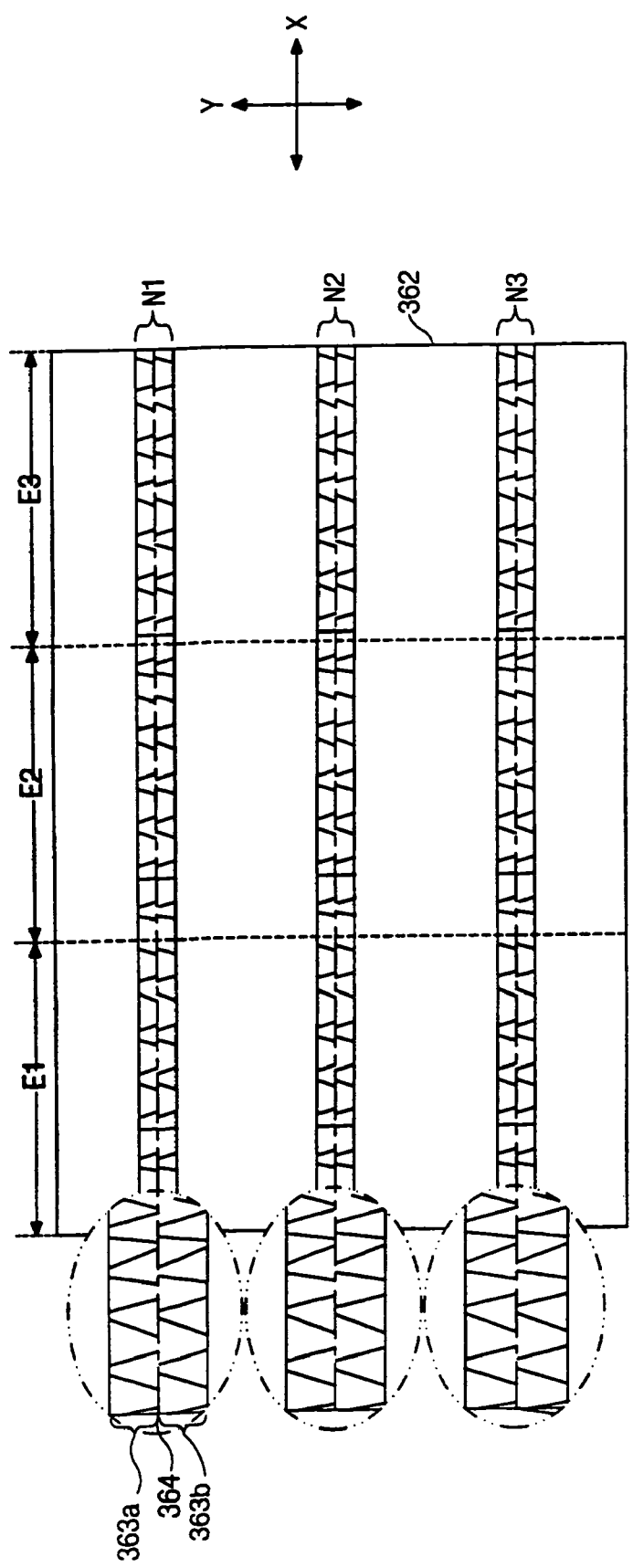

FIG. 10A shows the initial step of crystallizing an amorphous silicon film 362 using a first laser beam irradiation. As shown, since the initial step is similar to that used when forming silicon for the driving circuits (reference FIG. 9A) some detailed explanation will be omitted. Each of the crystallized regions "N1," "N2," and "N3" has a first grain region 363a, a middle 364 and a second grain region 363b through first to third blocks $E_1$ to $E_3$. Like the initial steps for the driving circuits, each crystallized region "N1," "N2," or "N3" has a width of 2 micrometers, which corresponds to the width of the light transmitting portions. As previously mentioned, the grains of the first and second grain regions 363a and 363b have grain boundaries that are perpendicular to the interfaces between crystalline silicon and amorphous silicon.

Figure 10B:
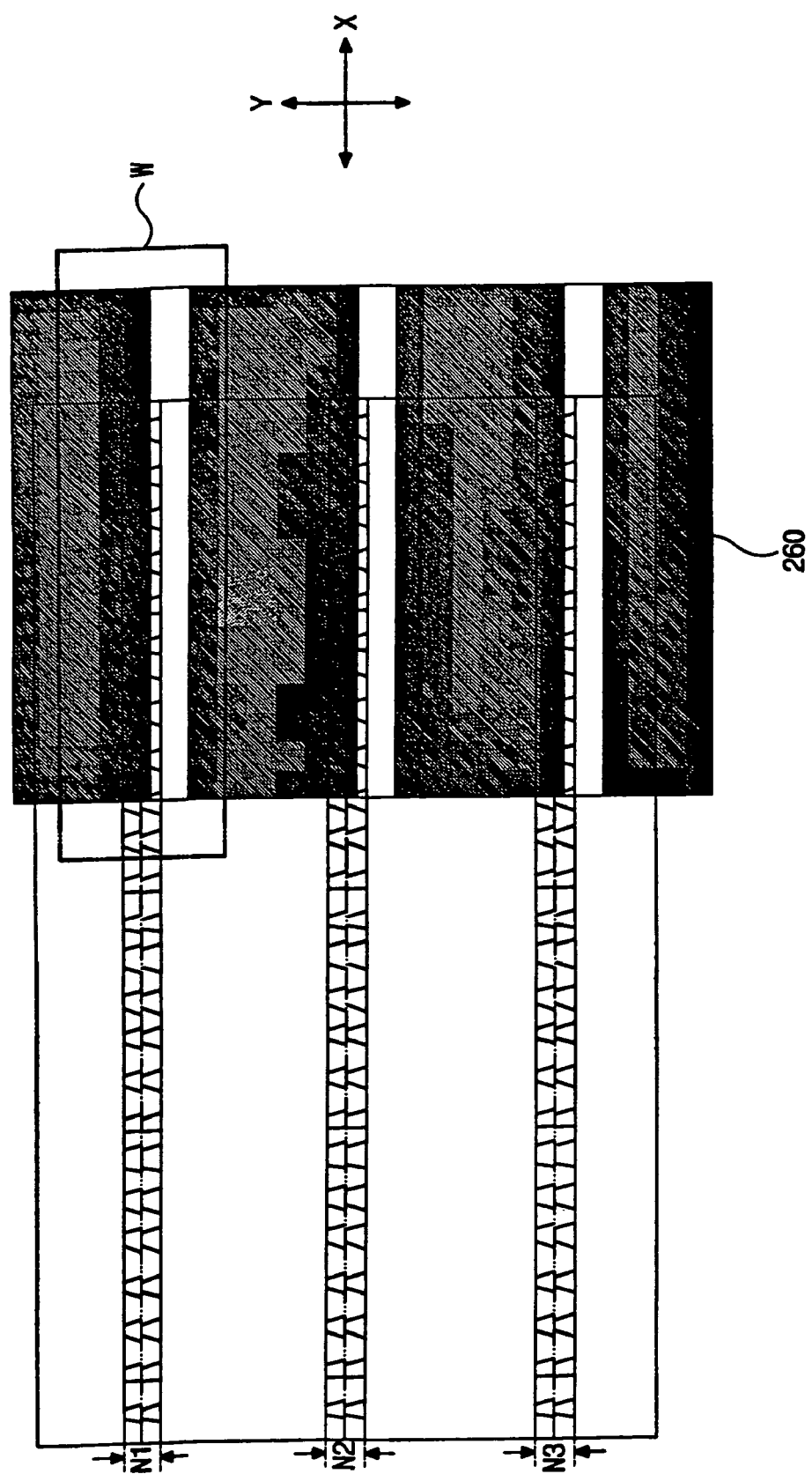
Figure 10C:
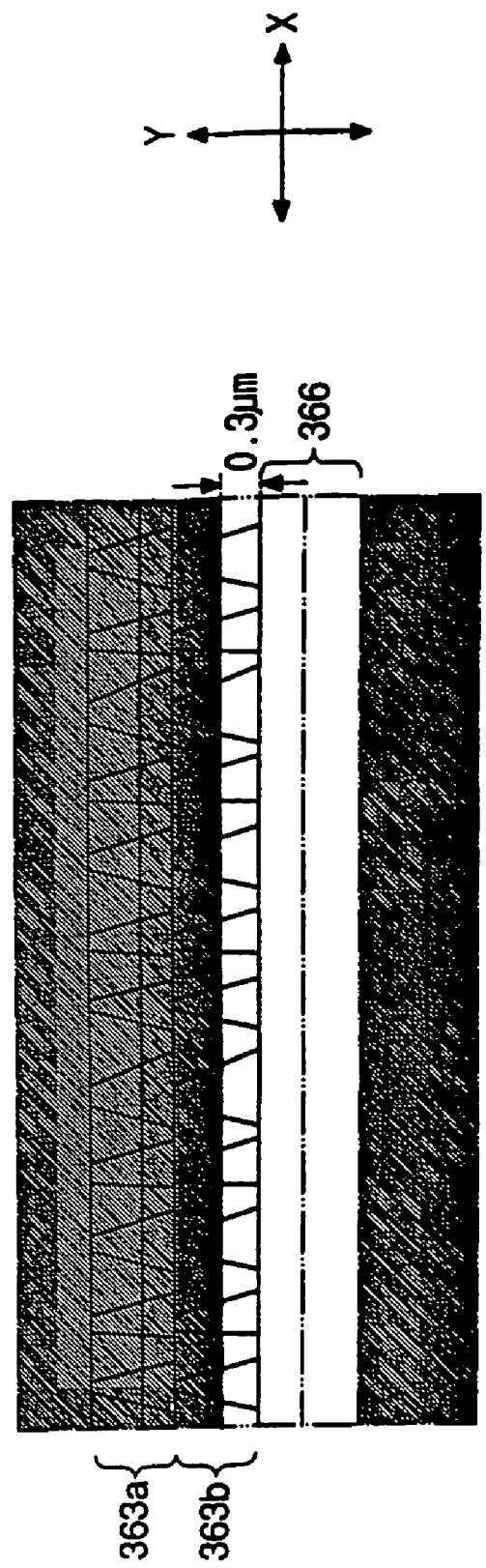

FIG. 10B is a plan view illustrating the mask adjustment for another amorphous silicon crystallization in an X-axial direction. FIG. 10C is an enlarged plan view of a portion "W" of FIG. 9B.

Referring now to FIGS. 10B and 10C, after the first X-axial laser beam irradiation, the X-Y stage or the mask moves in the Y-axial direction by a distance of about 1.7 micrometers. Therefore, each of the light transmitting portions of the mask 260 exposes portions of the second grains region 363b and a new amorphous silicon region 366. Since the mask 260 moves by 1.7 micrometers in the Y-axial direction, the exposed portions of the second grain region 363b is about 0.3 micrometers wide, and the newly exposed amorphous silicon regions 366 have a width of about 1.7 micrometers (which is the same as the translation distance).

Therefore, the regions irradiated by the laser beam are melted and then crystallized in the manner described above, reference FIG. 10D. The silicon grains of the second grain region 363b serve as seeds for this crystallization, and thus the lateral grain growth proceeds in the melted region in the Y-axial direction. As a result, grain region 368a extending from the second grain region 363b are formed as shown in FIG. 10D. Further, silicon grains grown from a new interface are also formed in a grain region 368b as shown in FIG. 10D. As previously mentioned, the lateral grain growth stops when the grains collide in the middle of the silicon region melted by this laser beam irradiation. Accordingly, referring to FIG. 10D, the large grain regions 368a have a width of about 1.7 micrometers and the grain regions 363a and 368b have a width of about 1 micrometer.

Figure 10E:
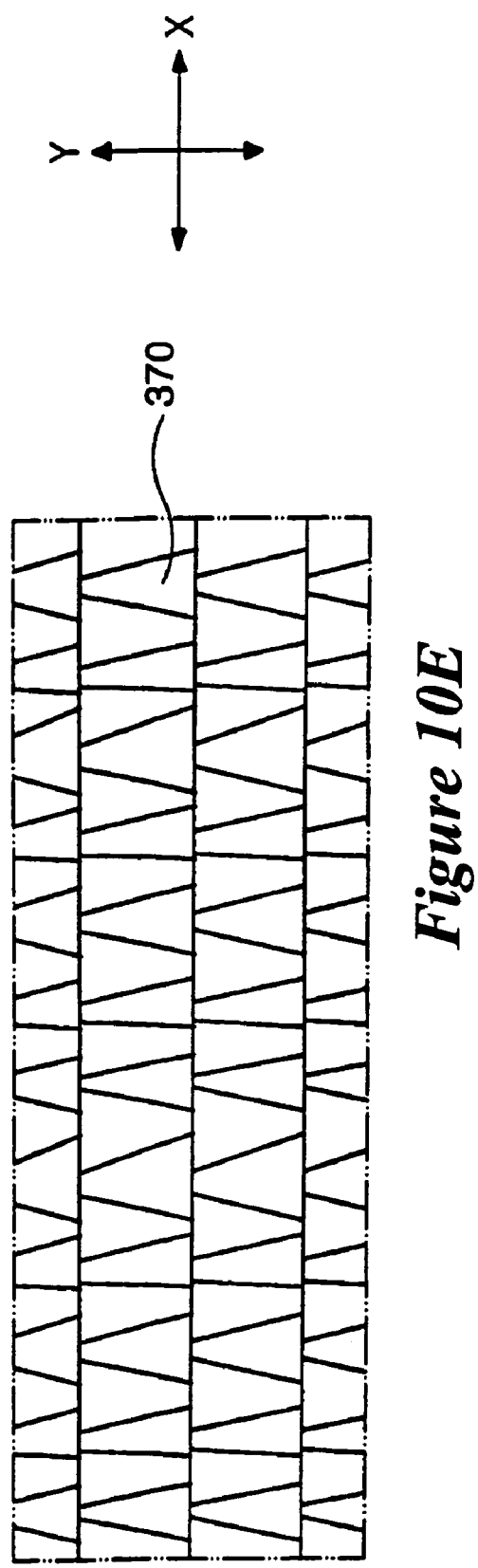

Accordingly, by repeating the foregoing steps of moving, melting and crystallizing, the amorphous silicon film is crystallized to form grains 370 as shown in FIG. 10E. Each grain 206 has a width of about 1.7 micrometers.

The crystallizing process for the TFTs illustrated in FIGS. 10A to 10E forms grains having relatively short lengths, but also a short crystallization process time. Although the TFTs grains 370 are 1.7 micrometers in length, they are sufficient for the active layers of TFTs because their carrier mobility is sufficient. As widely known, grains having a length of about 1 micrometer have sufficient good carrier mobility for TFTs.

Referring now back to FIG. 4, it should be understood that amorphous silicon can exist between the display region and the driving region.

Figure 11:
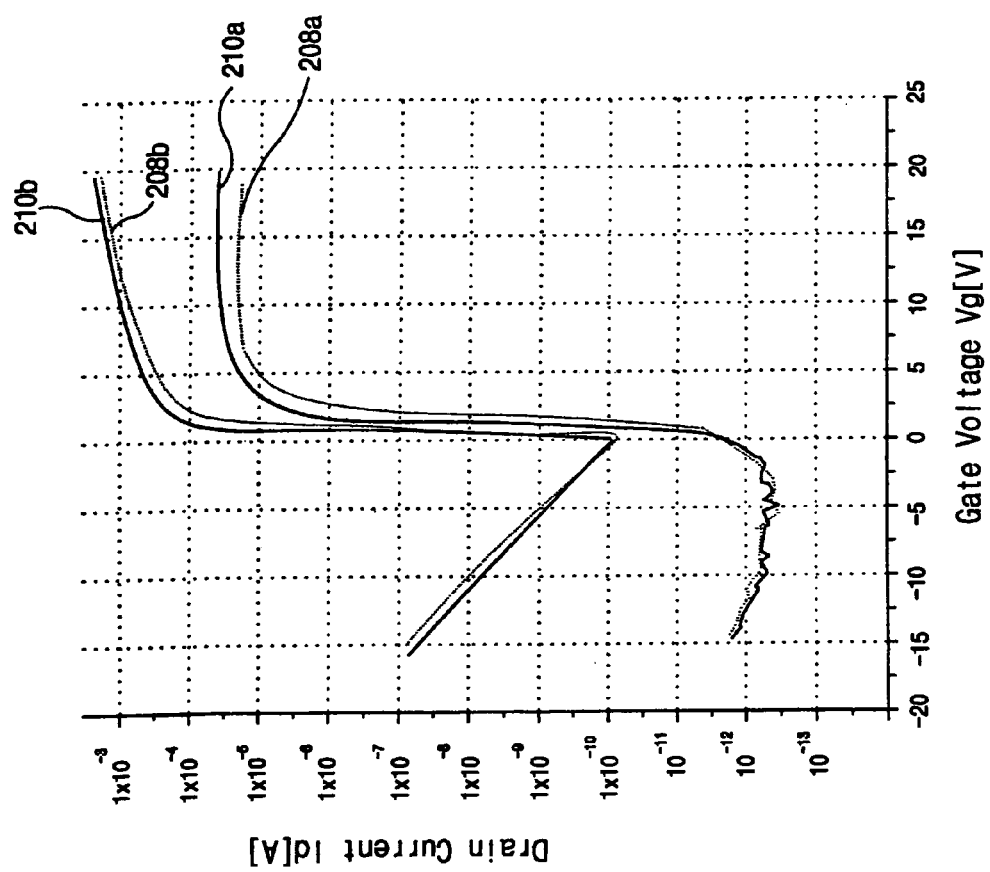
FIG. 11 is a graph showing transfer characteristics of crystalline silicon films that are produced in accord with the principles of the present invention.

FIG. 11 is a graph showing the transfer characteristics of crystalline silicon film formed in accordance with the principles of the present invention. To produce FIG. 11, as the gate voltage $V_g$ is gradually increased from −15V to +20V at a fixed rate, the variation of the drain current $I_d$ through an active channel layer was measured. Further, the drain voltage $V_d$ was set at 0.1V and at 10V ($V_d$=0.1V and $V_d$=10V), while the transfer characteristics are measured.

Depicted lines 208a and 208b represent the case when the translation distance was 1.7 micrometers, while depicted lines 210a and 210b represent the case when the translation distance was 0.7 micrometers. Furthermore, the lines 208a and 210a show the results when the drain voltage was 0.1V, while the lines 208b and 210b show the result when the drain voltage was 10V. Hereinafter, the reference will be explained in detail when the drain voltage was 10V.

As shown in FIG. 11, when compared to the line 210b (i.e., a translation distance of 0.7 micrometers and a drain voltage of 10V) and the line 208b (i.e., a translation distance of 1.7 micrometers and a drain voltage of 10V), the drain current of the line 210b is greater than that of the line 208b. Namely, when translation distance is 0.7 micrometers, the drain current is larger than when the translation distance is 1.7 micrometers. When the translation distance was 0.7 micrometers, the field effect mobility of the crystalline silicon film was 200 cm$^2$/V·s. Additionally, when the translation distance was 1.7 micrometers, the field effect mobility of the crystalline silicon film was 120 cm$^2$/V·s. As a result, it is noticeable that the crystalline silicon film formed by the principles of the present invention satisfies the operating characteristics of both CMOS and TFTs.

In the present invention, only one mask is used in crystallizing both the driving and display regions of an amorphous silicon film. By adjusting the mask movement distance, the driving and display regions of the amorphous silicon film can be crystallized, respectively, using the same mask. Since the mask moves larger distances when crystallizing the display region of the amorphous silicon film the crystallization process time can be dramatically reduced while still providing suitable silicon layers.

Now with reference to FIG. 12, a method of manufacturing driving and switching devices using crystalline silicon layer formed by the present invention will be explained. As the resolution of a liquid crystal display device become greater, the pad pitch of the signal lines and scanning lines is reduced. Thus, it becomes more difficult to bond a TCP (Tape Carrier Package) to the pads. However, SLS grown polycrystalline silicon can be used for driving ICs (Integrated Circuits) and can be formed on the same substrate as the thin film transistors. Such formation of driving ICs on a substrate decreases production costs and can ease fabrication difficulties.

As shown in FIG. 4, the liquid crystal panel 140 includes a display region 102 and a driving region 104 having driving circuits 104a and 104b. In the display region 102 are a plurality of switching devices, i.e., thin film transistors (TFTs). Those driving circuits 104a and 104b include a plurality of CMOS (Complementary Metal Oxide Semiconductor) devices.

Figure 12:
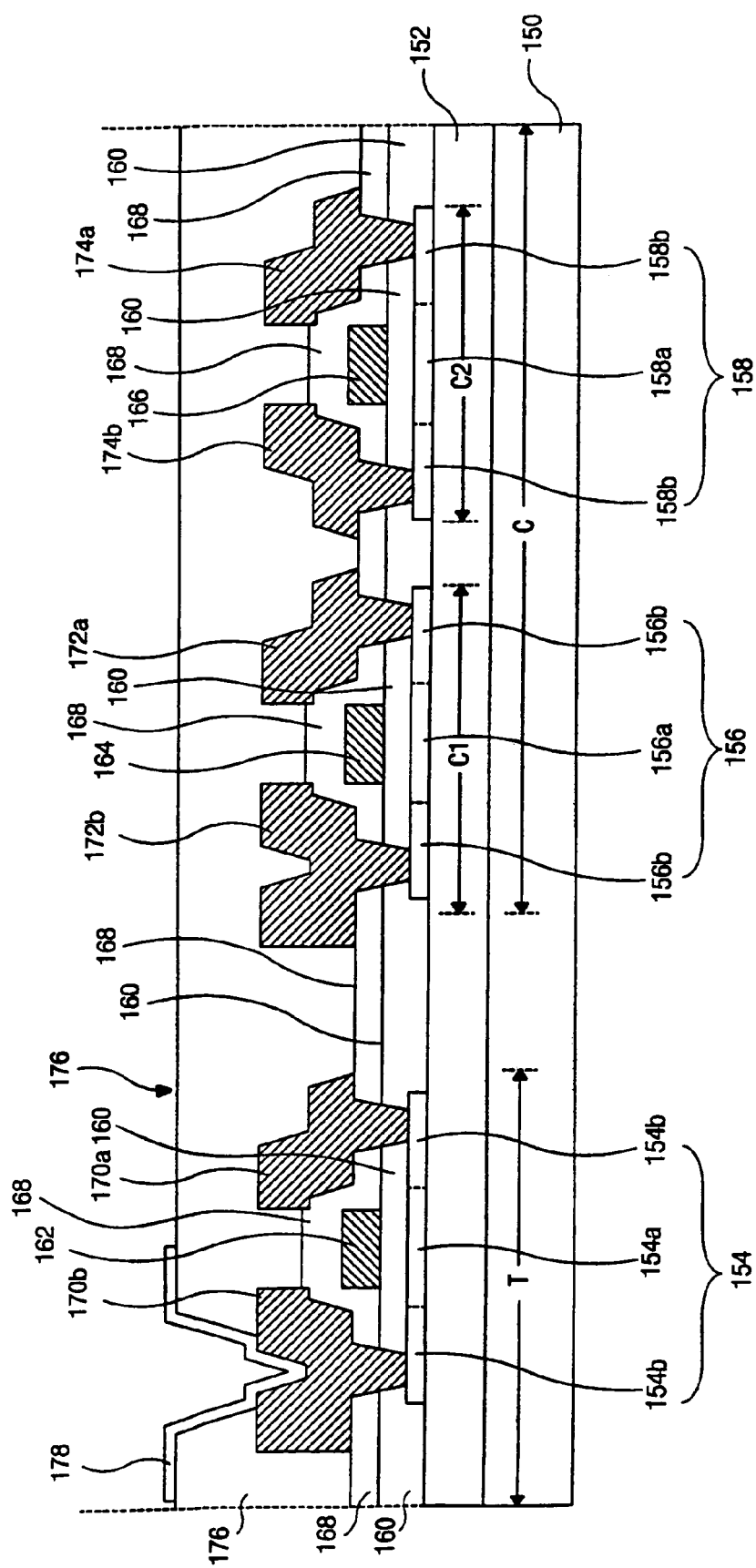
FIG. 12 is a cross-sectional view showing a switching device and CMOS transistors that have active layers crystallized according to the principles of the present invention.

As shown in FIG. 12, a CMOS device C is comprised of an N-type TFT C1 and a P-type TFT C2, which are driven by an inverter in the normal totem pole fashion. Since a CMOS device C consumes little electric power, it is a very suitable driving circuit. Such CMOS devices require fast operating characteristics, characteristics that are meet by active layers comprised of polycrystalline silicon formed by the inventive method. Further, since the TFT T of FIG. 12 is formed of polycrystalline silicon fabricated according to the principles of the present invention, that TFT has high electron mobility, which improves display quality.

The fabrication process for the CMOS device C and the thin film transistor T will be explained as follows. At this time, it is supposed that the thin film transistor T is an N-type.

First, a buffer layer 152 is formed on a transparent substrate 150. An amorphous silicon (a-Si:H) layer that includes hydrogen is then formed on the buffer layer 152. That amorphous silicon is subsequently dehydrogenated. Thereafter, the amorphous silicon layer is crystallized using one of the aforementioned methods (first or second embodiments), thereby forming a polycrystalline silicon layer.

The polycrystalline silicon layer is patterned to form first to third active layers 154, 156 and 158. The first polycrystalline silicon active layer 154 is divided into an active channel region 154a and two doping regions 154b that are disposed on both sides of the active channel region 154a.

Furthermore, the second polycrystalline silicon active layer 156 is divided into an active channel region 156a and two doping regions 156b, and the third polycrystalline silicon active layer 158 is divided into an active layer 158a and two doping regions 158b. A first insulation layer 160 is formed on the buffer layer 152 so as to cover the polycrystalline silicon active layers 154, 156 and 158. Gate electrodes 162, 164 and 166 are then formed on the first insulation layer 160, specifically over the active channel regions 154a, 156a and 158a.

Thereafter, the doping regions 154b, 156b and 158b are doped while using the gate electrodes 162, 164 and 166 as masks. The doping regions 154b and 156b are doped by $n^+$ ions, whereas the doping regions 158b are doped by $p^+$ ions. Therefore, the transistors T and C1 become N-type transistors and the transistor C2 becomes a P-type transistor.

Thereafter, a second insulation layer 168 is formed on the first insulation layer 160 to cover the gate electrodes 162, 164 and 166. The first and second insulation layers 160 and 168 are then patterned to form contact holes that expose impurity-doped regions 154b, 156b and 158b. After patterning the first and second insulation layers 160 and 168, a metal layer is formed on the second insulation layer 168. That metal layer is then patterned to form source electrodes 170a, 172a and 174a and drain electrodes 170b, 172b and 174b. As shown in FIG. 11, the source electrodes 170a, 172a and 174a contact the impurity-doped regions 154b, 156b and 158b, respectively, on the right side of the transistors. The drain electrodes 170b, 172b and 174b also contact the impurity-doped regions 154b, 156b and 158b, respectively, on the left side of the transistors. Therefore, the thin film transistor T and the CMOS device C are formed. A passivation layer 176 is then formed on the second insulation layer 168 to cover all transistors T, C1 and C2. The passivation layer 176 is then patterned to expose a portion of the drain electrode 170b of the thin film transistor T. Thus, a pixel electrode 178 formed on the passivation layer 176 contacts the drain electrode 170b of the thin film transistor T.

The switching devices and operating devices shown in FIG. 11 is fabricated using the crystalline silicon that is crystallized by the first and second embodiment of the present invention, so that the process time can be substantially shortened and the manufacturing yield increases.

According to the SLS method of the present invention, since the only one mask is used in crystallizing both the driving region and display region, the cost of productivity decreases. Since the crystallization process time is relatively short when forming the crystalline silicon film for the TFTs, the yields of manufacturing increases.

It will be apparent to those skilled in the art that various modifications and variations can be made in the method of crystallizing the amorphous silicon without departing from the spirit or scope of the inventions. Thus, it is intended that the present invention cover the modifications and variations of this invention provided they come within the scope of the appended claims and their equivalents.

What is claimed is:

1. A method of crystallizing an amorphous silicon film using a mask with a light absorptive portion and a plurality of stripe-shaped light transmitting portions, the method comprising;

locating a substrate having an amorphous silicon film in a sequential lateral solidification (SLS) apparatus;

functionally dividing the amorphous silicon film into a driving region for driving devices and a display region for thin film transistors;

irradiating the driving region using a laser beam that passes through the mask such that laterally grown grains are formed in the driving region, wherein laterally grown grains form a first grain region, a second grain region, and a first middle section between the first and second grains regions;

moving the mask relative to the substrate by a translation distance that is less than half the width of the light transmitting portions and such that the light transmitting portions expose a portion of the first grain region, the first middle section, and the second grain region;

performing a second crystallization on the driving region such that grains formed in the first irradiation of the driving region grow by a second irradiation of the driving region;

irradiating the display region using a laser beam that passes through the mask such that laterally grown grains are formed in the display region, wherein laterally grown grains form a third grain region, a fourth grain region, and a second middle section between the third and fourth grains regions;

moving the mask relative to the substrate by a translation distance that is greater than half the width of the light transmitting portions and such that the light transmitting portions exposes a portion of the fourth grain region; and performing a second crystallization on the display region such that grains formed in the first irradiation of the display region grow by a second irradiation of the display region.

2. The method of claim 1, further comprising X-axially moving the mask a plurality of times to complete an X-axis directional crystallization.

3. The method of claim 2, further comprising moving the mask in the Y-axial direction by the length of the light transmitting portions after completion of the X-axial directional crystallization.

4. The method of claim 3, further comprising conducting a second X-axis directional crystallization after moving the mask in the Y-axial direction.

5. The method of claim 1, wherein the translation distance that is less than half the width of the stripe-shaped light transmitting portions is between 0.5 and 0.8 micrometers.

6. The method of claim 1, wherein the translation distance that is greater than half the width of the stripe-shaped light transmitting portions is between 1.6 and 1.8 micrometers.

7. The method of claim 1, wherein the length of lateral grain growth in the driving region is between 10 and 13 micrometers.

8. The method of claim 1, wherein the length of lateral grain growth in the display region is between 1.5 and 3 micrometers.

9. The method of claim 1, wherein the width of the stripe-shaped light transmitting portions is less than or equal to twice the maximum length of lateral grain growth that could be grown under existing conditions by sequential lateral solidification (SLS).

10. The method of claim 1, wherein the width of the stripe-shaped light transmitting portions is about 2 micrometers.

11. The method of claim 1, wherein the distance between the stripe-shaped light transmitting portions is about 10 micrometers.

12. The method of claim 1, wherein the length of the stripe-shaped light transmitting portions is about 10 micrometers.

13. A method of crystallizing an amorphous silicon film using a mask that includes a light absorptive portion for blocking laser beams and a plurality of stripe-shaped light transmitting portions for passing laser beams, the method comprising;

locating an amorphous silicon bearing substrate in a sequential lateral solidification (SLS) apparatus;

functionally dividing the substrate into a driving region for driving devices and a display region for thin film transistors;

irradiating the driving region using a laser beam that passes through the mask such that laterally grown grains are formed in the irradiated driving region, wherein the grains include a first grain region, a second grain region, and a first middle section between the first and second grains regions;

moving the mask a plurality of times by the length of the stripe-shaped light transmitting portions to complete an X-axis directional crystallization of the amorphous silicon film in the driving region;

Y-axially moving the mask relative to the substrate by a translation distance that is less than half the width of the stripe-shaped light transmitting portions after completing the X-axis directional crystallization such that each of the stripe-shaped light transmitting portions exposes a portion of the first grain region, the first middle section, and the second grain region;

performing a second X-axial directional crystallization of the driving region such that laterally growing grains grow in irradiated portions of the driving region;

irradiating the display region using a laser beam that passes through the mask such that laterally grown grains are formed in the display region, wherein the grains form a third grain region, a fourth grain region, and a second middle section between the third and fourth grains regions;

moving the mask a plurality of times by the length of the stripe-shaped light transmitting portions to complete an X-axis directional crystallization of the amorphous silicon film in the display region;

Y-axially moving the mask relative to the substrate by a translation distance that is greater than half the width of the stripe-shaped light transmitting portions after completing the X-axis directional crystallization of the display region such that each of the X-axially stripe-shaped light transmitting portion exposes a portion of the fourth grain region; and performing a second X-axial directional crystallization of the display region such that laterally growing grains grow in irradiated portions of the display region.

14. The method of claim 13, further comprising moving the mask a plurality of times to complete a Y-axis directional crystallization.

15. The method of claim 13, wherein the translation distance that is less than half the width of the stripe-shaped light transmitting portions is between 0.5 and 0.8 micrometers.

16. The method of claim 13, wherein the translation distance that is greater than half the width of the stripe-shaped light transmitting portions is between 1.6 and 1.8 micrometers.

17. The method of claim 13, wherein the grain length in the driving region is between 10 and 13 micrometers.

18. The method of claim 13, wherein the grain length in the display region is between 1.5 and 3 micrometers.

19. The method of claim 13, wherein the width of the stripe-shaped light transmitting portions is less than or equal to twice the maximum length of lateral grain growth that could be grown under existing conditions by sequential lateral solidification (SLS).

20. The method of claim 13, wherein the width of the stripe-shaped light transmitting portions is about 2 micrometers.

21. The method of claim 13, wherein the distance between stripe-shaped light transmitting portions is about 10 micrometers.

22. The method of claim 13, wherein the length of the stripe-shaped light transmitting portions is about 10 micrometers.

* * * * *